(12) United States Patent
Tsai

(10) Patent No.: US 12,457,730 B2
(45) Date of Patent: Oct. 28, 2025

(54) METHOD FOR MANUFACTURING SEMICONDUCTOR DEVICE HAVING BURIED GATE STRUCTURE

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 657 days.

(21) Appl. No.: 17/861,743

(22) Filed: Jul. 11, 2022

(65) Prior Publication Data

US 2024/0015947 A1  Jan. 11, 2024

(51) Int. Cl.
*H10B 12/00* (2023.01)

(52) U.S. Cl.
CPC ........... *H10B 12/053* (2023.02); *H10B 12/34* (2023.02)

(58) Field of Classification Search
CPC .... H10B 12/053; H10B 12/34; H10B 12/315; H10B 12/30; H10D 64/514; H10D 64/512–513; H10D 64/517–519; H10D 64/021; H10D 64/025–027
See application file for complete search history.

(56) References Cited

U.S. PATENT DOCUMENTS

| 11,075,272 | B2 * | 7/2021 | Kim | ..................... H10D 64/513 |
| 2018/0145080 | A1 * | 5/2018 | Kim | ..................... H10D 62/115 |
| 2020/0395455 | A1 | 12/2020 | Kim | |
| 2023/0411475 | A1 | 12/2023 | Tsai | |

FOREIGN PATENT DOCUMENTS

| TW | 202213721 A | 4/2022 |
| TW | 202218113 A | 5/2022 |
| TW | 202224188 A | 6/2022 |

* cited by examiner

*Primary Examiner* — Christine S. Kim
*Assistant Examiner* — Andrew Victor Prostor
(74) *Attorney, Agent, or Firm* — MUNCY, GEISSLER, OLDS & LOWE, P.C.

(57) ABSTRACT

The present disclosure provides a method of manufacturing a semiconductor device. The method includes forming a trench in a substrate and disposing a lower gate electrode in the trench. The method also includes disposing a first dielectric layer on the lower gate electrode in the trench and partially removing the first dielectric layer to expose a portion of the lower gate electrode.

17 Claims, 25 Drawing Sheets

METHOD FOR MANUFACTURING SEMICONDUCTOR DEVICE HAVING BURIED GATE STRUCTURE

TECHNICAL FIELD

The present disclosure relates to a method for manufacturing a semiconductor device, and more particularly, to a method for manufacturing a buried gate structure having a dielectric layer and a barrier layer between two electrodes.

DISCUSSION OF THE BACKGROUND

A buried gate structure of a semiconductor device includes a gate dielectric layer and a gate electrode in a trench. The gate dielectric layer covers the surface of the trench and the gate electrode partially fills the trench on the gate dielectric layer. The buried gate structure may be adjacent to (or on the same level as) impurity regions or junction regions in an active region of the semiconductor device.

Gate induced drain leakage (GIDL) characteristics affect performance of the semiconductor device. In a conventional process, the gate dielectric layer (or a sidewall dielectric) of the buried gate structure may inevitably be consumed and the effective electric field near the gate electrode may become higher. This causes GIDL to occur. GIDL discharges the stored charges, thereby deteriorating the operational reliability of the semiconductor device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate having a trench and a gate structure in the trench. The gate structure includes a lower gate electrode and an upper gate electrode over the lower gate electrode. The gate structure also includes a first barrier layer disposed between the lower gate electrode and the upper gate electrode. The gate structure also includes a first dielectric layer disposed between the lower gate electrode and the upper gate electrode. The first dielectric layer is adjacent to the first barrier layer.

Another aspect of the present disclosure provides a semiconductor device. The semiconductor device includes a substrate having a trench and a gate structure in the trench. The gate structure includes a lower gate electrode and a lower dielectric layer between the lower gate electrode and the substrate. The gate structure also includes a first barrier layer over the lower gate electrode. The first barrier layer is spaced apart from the lower dielectric layer.

Another aspect of the present disclosure provides a method of manufacturing a semiconductor device. The method includes forming a trench in a substrate and disposing a lower gate electrode in the trench. The method also includes disposing a first dielectric layer on the lower gate electrode in the trench and partially removing the first dielectric layer to expose a portion of the lower gate electrode.

Forming a protection layer before disposing a barrier layer can prevent the gate dielectric layer (or a sidewall dielectric) from been damaged or consumed. Therefore, the effective electric field can be reduced and, consequently, GIDL can be reduced. A data retention time can be extended, and the operational reliability of the semiconductor device can also be improved.

In addition, a residual portion of the protection layer may be adjacent to the barrier layer. By using a protection layer having a low dielectric constant (such as lower than the dielectric constant of the sidewall dielectric), the effective electric field between the lower gate electrode and the upper gate electrode can be further decreased, which helps to mitigate GIDL while maintaining good device performance.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
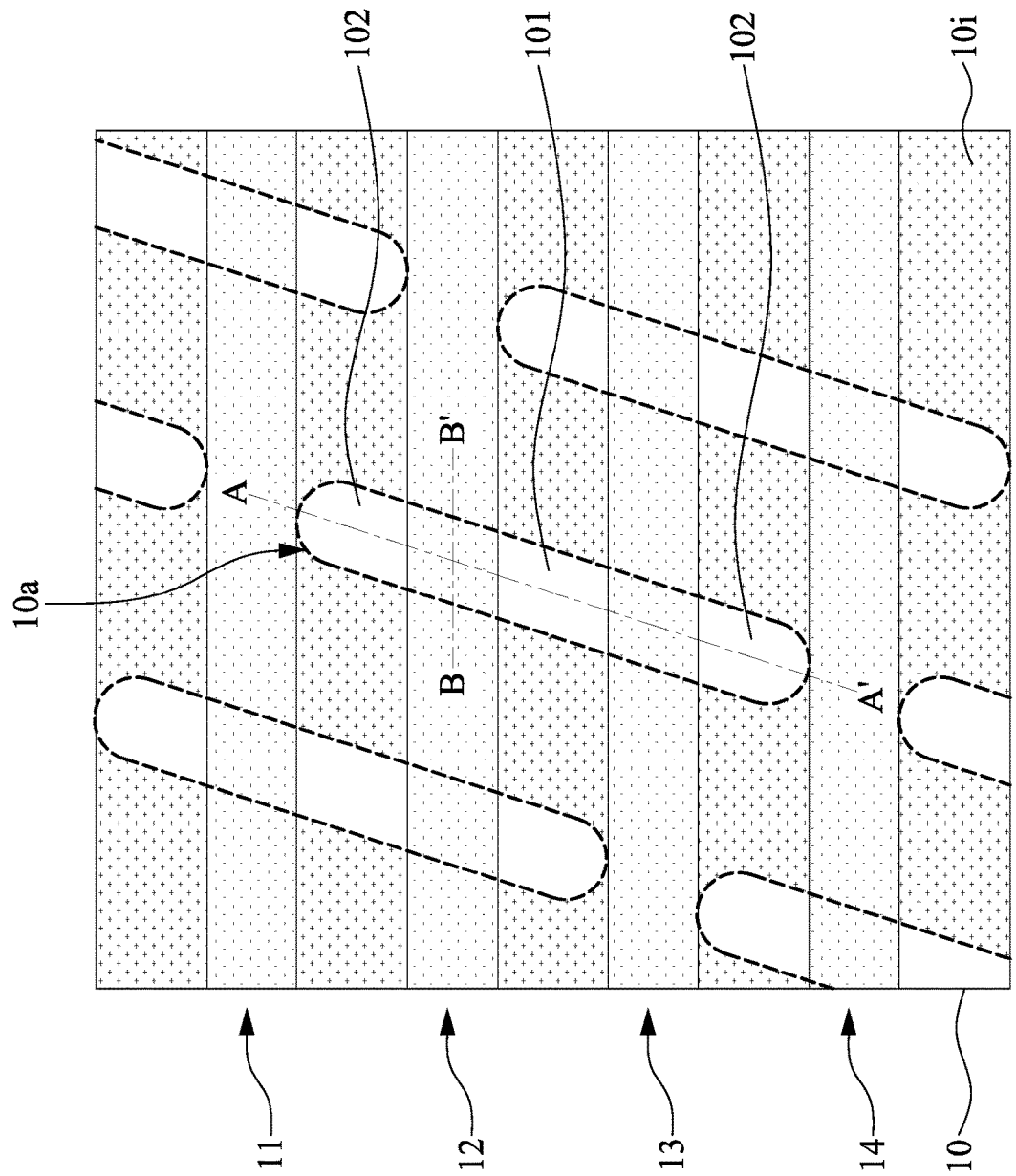
FIG. 1A is a schematic plane view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
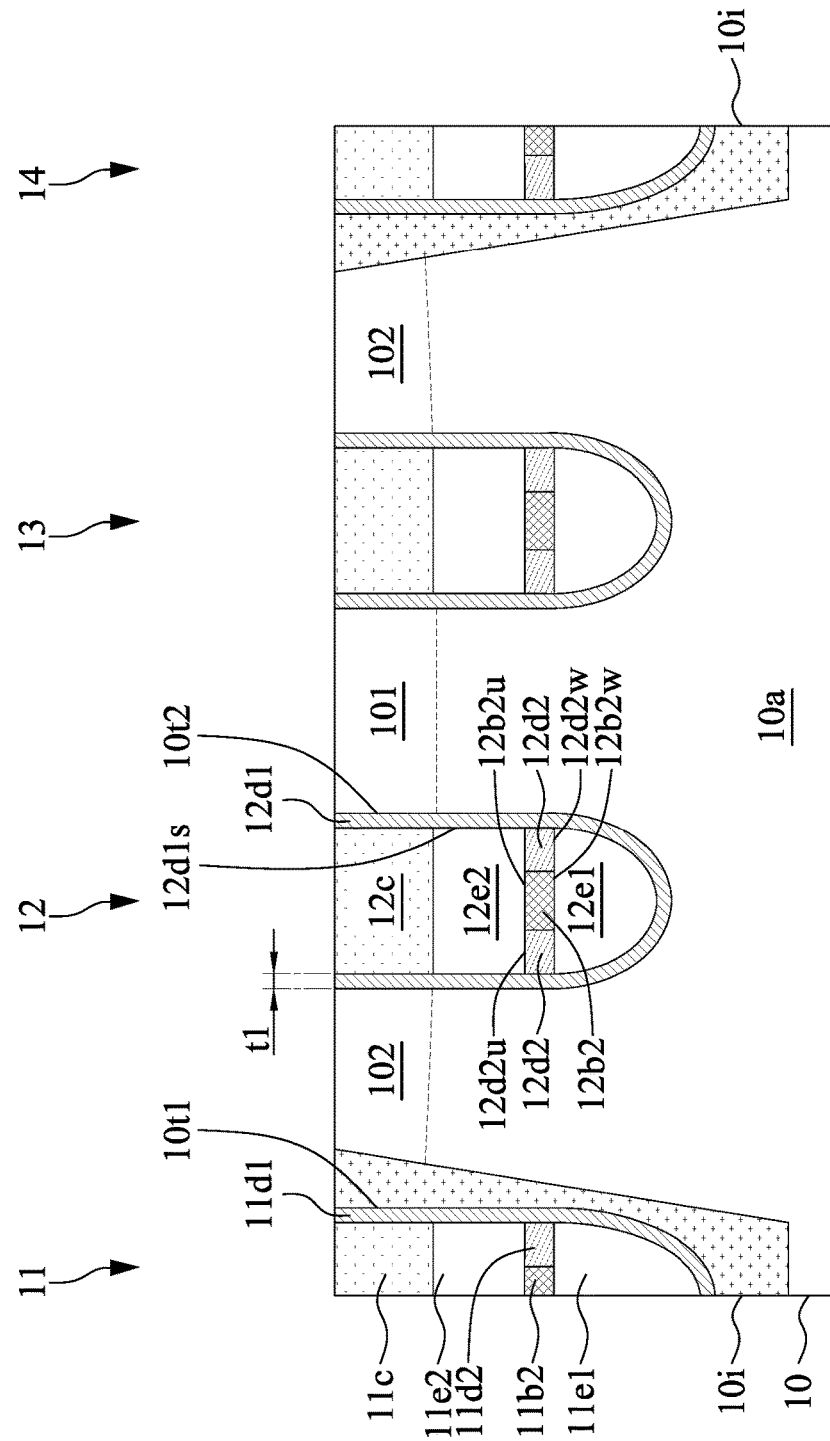
FIG. 1B is a schematic cross-sectional view illustrating the semiconductor device taken along an A-A' line shown in FIG. 1A.
Figure 1C:
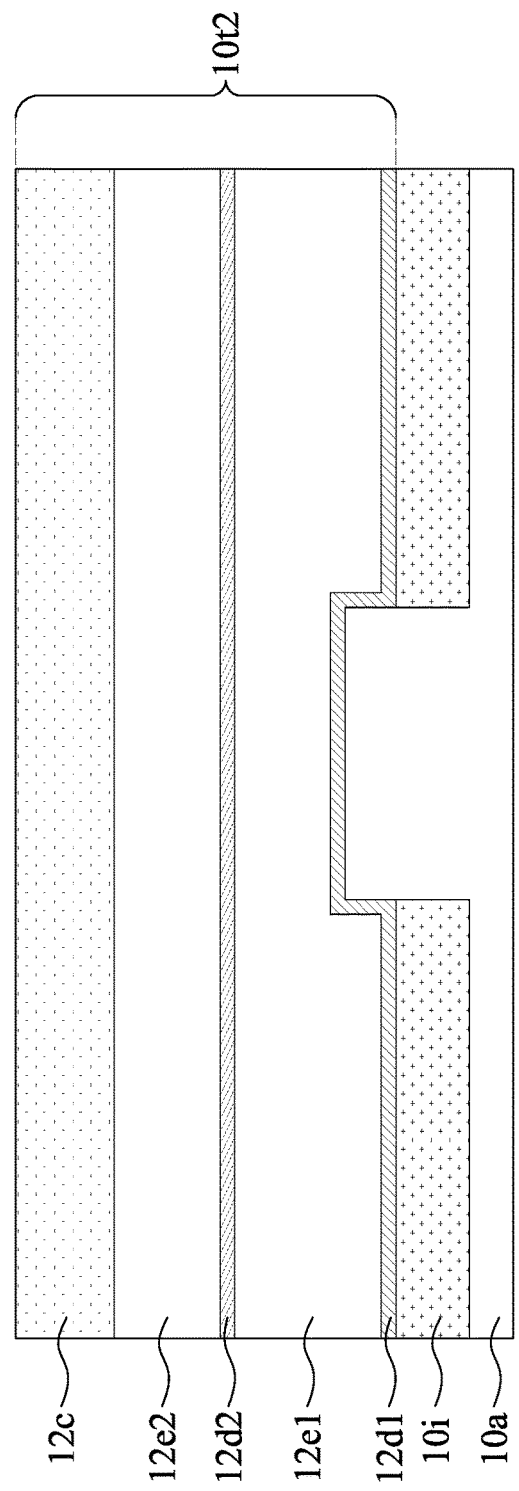
FIG. 1C is a schematic cross-sectional view illustrating the semiconductor device taken along a B-B' line shown in FIG. 1A.

FIG. 1A is a schematic plane view of a semiconductor device 1 in accordance with some embodiments of the present disclosure. FIG. 1B is a schematic cross-sectional view illustrating the semiconductor device 1 taken along an A-A' line shown in FIG. 1A. FIG. 1C is a schematic cross-sectional view illustrating the semiconductor device 1 taken along a B-B' line shown in FIG. 1A.

In some embodiments, the semiconductor device 1 may be disposed adjacent to a circuit. For example, the semiconductor device 1 may be disposed adjacent to a memory device such as a dynamic random access memory (DRAM) device or the like.

Referring to FIG. 1A, the semiconductor device 1 may include a plurality of active regions 10a and an isolation region 10i (or an isolation layer) formed on a substrate 10. The active regions 10a may be defined by the isolation region 10i.

The semiconductor device 1 may also include a plurality of gate structures, such as the gate structures 11, 12, 13 and 14. Each active region 10a may cross two gate structures and may be divided into three doped regions by the two gate structures. For example, the active region 10a may be divided into the first doped region 101 disposed between the two gate structures 12 and 13 and second doped regions 102 located at two sides of the first doped region 101.

The gate structures 11, 12, 13 and 14 may each have a line shape extending in any one direction. The gate structures 11, 12, 13 and 14 may each be a buried gate buried in a trench that runs through the active regions 10a and the isolation region 10i. The gate structures 11, 12, 13 and 14 may each include one or more main gate parts (or main gates) buried in the active regions 10a and one or more passing gate parts (or passing gates) buried in the isolation region 10i. For example, FIG. 1B shows a passing gate of the gate structure 11, a main gate of the gate structure 12, a main gate of the gate structure 13 and a passing gate of the gate structure 14. FIG. 1C shows a trench 10t2 (where the gate structure 12 is disposed) that runs through one of the active regions 10a and the isolation region 10i. The portion of the gate structure 12 over the active region 10a is a main gate.

As used herein, the term "main gate" refers to a gate that is configured to receive a voltage to address a memory cell, and the term "passing gate" refers to a gate that is configured to receive a voltage to address an adjacent memory cell.

For example, the gate structure 11 may be a passing gate in one memory cell shown in FIG. 1B, but become a main gate in another memory cell. In some embodiments, the gate structure 12 may be a main gate in one memory cell shown in FIG. 1B, but become a passing gate in yet another memory cell.

Although the main gate and the passing gate are both described above as being parts or portions of the gate structure, the main gate and the passing gate have different structures. For example, as shown in FIG. 1B, the trench 10t1 for the passing gate part of the gate structure 11 and the trench 10t2 for the main gate part of the gate structure 12 have different depths. The trench 10t1 may be deeper than the trench 10t2.

Referring to FIG. 1B, the semiconductor device 1 may include the substrate 10, and the gate structures 11, 12, 13 and 14 formed in the substrate 10.

The substrate 10 may include a semiconductor substrate. In some embodiments, the substrate 10 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a layered semiconductor such as silicon/silicon germanium, silicon-on-insulator, or silicon germanium-on-insulator.

The active region 10a and the isolation region 10i may be formed in the substrate 10. The active region 10a may be defined by the isolation region 10i. In some embodiments, the isolation region 10i may include shallow trench isolation (STI) structures. The STI structures may include, for example, silicon oxide ($SiO_2$), silicon nitride ($Si_3N_4$), silicon oxynitride ($N_2OSi_2$), silicon nitride oxide ($N_2OSi_2$), etc.

The first doped region 101 and the second doped regions 102 may be formed in the active region 10a. In some embodiments, the first doped region 101 and the second doped regions 102 may be disposed over or proximal to the top surface of the active region 10a. The first doped region 101 and the second doped region 102 may be located on both sides of the trench 10t2.

In some embodiments, the first doped region 101 and the second doped region 102 may be doped with an N-type dopant such as phosphorus (P), arsenic (As), or antimony (Sb). In some other embodiments, the first doped region 101 and the second doped region 102 may be doped with a P-type dopant such as boron (B) or indium (In). In some embodiments, the first doped region 101 and the second doped region 102 may be doped with dopants or impurity ions having the same conductivity types. In some embodiments, the first doped region 101 and the second doped region 102 may be doped with dopants or impurity ions having different conductivity types.

The bottom surfaces of the first doped region 101 and the second doped region 102 may be located at a predetermined depth from the top surface of the active region 10a. The first doped region 101 and the second doped region 102 may contact sidewalls of the trench 10t2. The bottom surfaces of the first doped region 101 and the second doped region 102 may be higher than the bottom surface of the trench 10t2. Similarly, the bottom surfaces of the first doped region 101 and the second doped region 102 may be higher than the bottom surface of the trench 10t1.

In some embodiments, the first doped region 101 and the second doped region 102 may be referred to as source/drain regions. In some embodiments, the first doped region 101 may include a bit-line contact region and may be electrically connected with a bit-line structure (such as the bit-line structure 32 shown in FIG. 4). The second doped region 102 may include a storage node junction region and may be electrically connected with a memory element (such as the memory element 34 shown in FIG. 4).

The trench 10t1 in the isolation region 10i and the trench 10t2 in the active region 10a are spaces in which the gate structures 11 and 12 may be formed. The gate structure 11 in the isolation region 10i may include a passing gate. The gate structure 12 in the active region 10a may include a main gate.

The trench 10t2 may have a shallower depth than the trench 10t1. The bottom of the trenches 10t1 and 10t2 may each have a curvature as shown in the embodiment of FIG. 1B. However, in some other embodiments, the bottom of the trenches 10t1 and 10t2 may be flat or may have other shapes.

The gate structure 12 may include second and first dielectric layers 12d1, 12d2, lower and upper gate electrodes 12e1, 12e2, a first barrier layer 12b2 and a capping layer 12c.

The second dielectric layer 12d1 may be conformally formed on the bottom surface and sidewall of the trench 10t2. The second dielectric layer 12d1 may surround or cover a part of the lower gate electrode 12e1. The second dielectric layer 12d1 may separate the lower gate electrode 12e1 from the substrate 10.

A sidewall 12d1s (or an extending portion) of the second dielectric layer 12d1 may be disposed between the upper gate electrode 12e2 and the substrate 10. A bottom (or a base portion) of the second dielectric layer 12d1 may be disposed between the lower gate electrode 12e1 and the substrate 10.

For example, the sidewall 12d1s may extend from the lower gate electrode 12e1 to the upper gate electrode 12e2. For example, the sidewall 12d1s may extend from the lower gate electrode 12e1 to the capping layer 12c. The sidewall 12d1s may contact the upper gate electrode 12e2. The sidewall 12d1s may contact the capping layer 12c. The sidewall 12d1s may be an inner surface of the trench 10t2.

During an etch-back operation on the first barrier layer 12b2 (such as the operation illustrated in FIG. 5J), the sidewall 12d1s of the second dielectric layer 12d1 may be protected. For example, the sidewall 12d1s of the second dielectric layer 12d1 may not be etched, consumed or damaged during the etch-back operation on the first barrier layer 12b2.

In some embodiments, the sidewall 12d1s of the second dielectric layer 12d1 may have a substantially vertical profile. For example, the sidewall 12d1s of the second dielectric layer 12d1 may be substantially perpendicular to the top surface of the active region 10a. For example, the sidewall 12d1s of the second dielectric layer 12d1 may be substantially perpendicular to a top surface 12b2u of the first barrier layer 12b2. For example, the sidewall 12d1s of the second dielectric layer 12d1 may be substantially perpendicular to a top surface 12d2u of the first dielectric layer 12d2.

In some embodiments, the second dielectric layer 12d1 may have a constant thickness. For example, the thickness t1 of the sidewall 12d1s (or the extending portion) of the second dielectric layer 12d1 between the upper gate electrode 12e2 and the substrate 10 and the bottom (or the base portion) of the second dielectric layer 12d1 between the lower gate electrode 12e1 and the substrate 10 may be substantially equal.

In some embodiments, the thickness t1 of the sidewall 12d1s (or the extending portion) of the second dielectric layer 12d1 between the upper gate electrode 12e2 and the substrate 10 and the thickness of the bottom (or the base portion) of the second dielectric layer 12d1 between the lower gate electrode 12e1 and the substrate 10 may both be greater than about 3.6 nanometers (nm), such as about 4.0 nm, 5.0 nm or 6.0 nm.

Any two of a surface of the second dielectric layer 12*d*1, a surface of capping layer 12*c*, and the top surface of the active region 10*a* may be substantially coplanar.

In some embodiments, the second dielectric layer 12*d*1 may include, for example, silicon oxide (SiO$_2$), silicon nitride (Si$_3$N$_4$), silicon oxynitride (N$_2$OSi$_2$), silicon nitride oxide (N$_2$OSi$_2$), a high-k material or combinations thereof. Examples of the high-k material include a dielectric material having a dielectric constant that is higher than that of silicon dioxide (SiO$_2$), or a dielectric material having a dielectric constant higher than about 3.9. In some embodiments, the second dielectric layer 12*d*1 may include at least one metallic element, such as hafnium oxide (HfO$_2$), silicon doped hafnium oxide (HSO), lanthanum oxide (La$_2$O$_3$), lanthanum aluminum oxide (LaAlO$_3$), zirconium oxide (ZrO$_2$), zirconium orthosilicate (ZrSiO$_4$), aluminum oxide (Al$_2$O$_3$) or combinations thereof.

The first barrier layer 12*b*2 may be disposed between the lower and upper gate electrodes 12*e*1 and 12*e*2. The first barrier layer 12*b*2 may be sandwiched between the lower and upper gate electrodes 12*e*1 and 12*e*2. The first barrier layer 12*b*2 may be covered or embedded by the lower and upper gate electrodes 12*e*1 and 12*e*2. The first barrier layer 12*b*2 may directly contact the lower and upper gate electrodes 12*e*1 and 12*e*2.

The first barrier layer 12*b*2 may be spaced apart from the second dielectric layer 12*d*1. The first barrier layer 12*b*2 may be separated from the second dielectric layer 12*d*1 by the first dielectric layer 12*d*2. From a cross-sectional view as shown in FIG. 1B, the first barrier layer 12*b*2 may be disposed between two parts of the first dielectric layer 12*d*2.

In some embodiments, the first barrier layer 12*b*2 may include a metal-based material. The first barrier layer 12*b*2 may include metal nitride. The first barrier layer 12*b*2 may include titanium nitride (TiN) or tantalum nitride (TaN).

The first dielectric layer 12*d*2 may be disposed between the lower and upper gate electrodes 12*e*1 and 12*e*2. The first dielectric layer 12*d*2 may be sandwiched between the lower and upper gate electrodes 12*e*1 and 12*e*2. The first dielectric layer 12*d*2 may be covered or embedded by the lower and upper gate electrodes 12*e*1 and 12*e*2. The first dielectric layer 12*d*2 may directly contact the lower and upper gate electrodes 12*e*1 and 12*e*2.

The first dielectric layer 12*d*2 may separate the first barrier layer 12*b*2 from the second dielectric layer 12*d*1. The first dielectric layer 12*d*2 may be disposed adjacent to the first barrier layer 12*b*2. The first dielectric layer 12*d*2 may contact the first barrier layer 12*b*2.

From a cross-sectional view as shown in FIG. 1B, the first dielectric layer 12*d*2 may contact two sides of the first barrier layer 12*b*2. In some embodiments, the first dielectric layer 12*d*2 may surround the first barrier layer 12*b*2. For example, the first dielectric layer 12*d*2 may fully surround the first barrier layer 12*b*2 and prevent the first barrier layer 12*b*2 from contacting the sidewall 12*d*1*s* of the second dielectric layer 12*d*1.

In some embodiments, an upper surface 12*d*2*u* of the first dielectric layer 12*d*2 and an upper surface 12*b*2*u* of the first barrier layer 12*b*2 may be substantially coplanar. For example, the upper surface 12*d*2*u* of the first dielectric layer 12*d*2 and the upper surface 12*b*2*u* of the first barrier layer 12*b*2 may form a planar surface.

In some embodiments, a lower surface 12*d*2*w* of the first dielectric layer 12*d*2 and a lower surface 12*b*2*w* of the first barrier layer 12*b*2 may be substantially coplanar. For example, the lower surface 12*d*2*w* of the first dielectric layer 12*d*2 and the lower surface 12*b*2*w* of the first barrier layer 12*b*2 may form a planar surface.

In some embodiments, a thickness of the first dielectric layer 12*d*2 and a thickness of the first barrier layer 12*b*2 may be substantially equal.

During an etch-back operation on the first barrier layer 12*b*2 (such as the operation illustrated in FIG. 5J), the first dielectric layer 12*d*2 may prevent the sidewall 12*d*1*s* of the second dielectric layer 12*d*1 from being etched, consumed or damaged. Therefore, the first dielectric layer 12*d*2 may serve as a protection layer or a passivation layer for the second dielectric layer 12*d*1.

In some embodiments, the first dielectric layer 12*d*2 and the first barrier layer 12*b*2 may include different nitrides. For example, the first barrier layer 12*b*2 may include TiN and the first dielectric layer 12*d*2 may include a nitride other than TiN.

In some embodiments, a dielectric constant of the first dielectric layer 12*d*2 may be different from a dielectric constant of the second dielectric layer 12*d*1. For example, a dielectric constant of the first dielectric layer 12*d*2 may be lower than a dielectric constant of the second dielectric layer 12*d*1.

In some embodiments, the first dielectric layer 12*d*2 and the second dielectric layer 12*d*1 may be formed by different operations. For example, the second dielectric layer 12*d*1 may be formed by a thermal oxidation operation. The first dielectric layer 12*d*2 may be formed by an atomic layer deposition (ALD) process.

In some embodiments, the second dielectric layer 12*d*1 and the first dielectric layer 12*d*2 may have different densities, such as different particle densities. For example, a density of the second dielectric layer 12*d*1 may be lower than a density of the first dielectric layer 12*d*2. A density of the first dielectric layer 12*d*2 may be higher than a density of the second dielectric layer 11*d*1. For example, the first dielectric layer 12*d*2 may be denser than the second dielectric layer 12*d*1.

The lower gate electrode 12*e*1 may be disposed on the second dielectric layer 12*d*1 and spaced apart from the substrate 10 by the second dielectric layer 12*d*1. The lower gate electrode 12*e*1 may be spaced apart from the substrate 10 by a distance (e.g., the thickness t1).

The lower gate electrode 12*e*1 may be covered by the lower surface 12*d*2*w* of the first dielectric layer 12*d*2 and the lower surface 12*b*2*w* of the first barrier layer 12*b*2. The lower gate electrode 12*e*1 may contact the lower surface 12*d*2*w* of the first dielectric layer 12*d*2 and the lower surface 12*b*2*w* of the first barrier layer 12*b*2.

In some embodiments, the lower gate electrode 12*e*1 may include a single layer of metal, metal composite or layers of conductive materials. In some embodiments, the lower gate electrode 12*e*1 may include a metal-based material. For example, the lower gate electrode 12*e*1 may include titanium (Ti), titanium nitride (TiN), tantalum (Ta), tantalum nitride (TaN), tungsten (W), tungsten nitride (WN), a stack thereof or a combination thereof.

The upper gate electrode 12*e*2 may be disposed on the upper surface 12*d*2*u* of the first dielectric layer 12*d*2 and the upper surface 12*b*2*u* of the first barrier layer 12*b*2. The upper gate electrode 12*e*2 may contact the upper surface 12*d*2*u* of the first dielectric layer 12*d*2 and the upper surface 12*b*2*u* of the first barrier layer 12*b*2. The upper gate electrode 12*e*2 may be spaced apart from the substrate 10 by a distance (e.g., the thickness t1).

The upper gate electrode 12e2 may be surrounded or covered by the second dielectric layer 12d1 and the capping layer 12c.

In some embodiments, the upper gate electrode 12e2 may include a single layer of metal, metal composite or layers of conductive materials. In some embodiments, the upper gate electrode 12e2 may include polycrystalline silicon (poly-Si), titanium nitride (TiN), tungsten nitride (WN), or the like.

In some embodiments, the lower and upper gate electrodes 12e1 and 12e2 may function as word-lines. For example, the lower and upper gate electrodes 12e1 and 12e2 may be used with bit-lines (such as the bit-line structure 32 shown in FIG. 4) to address memory cells. For example, the upper gate electrode 12e2 may function as a gate electrode of a transistor in a memory cell. The second doped region 102 and the first doped region 101 may function as a drain region and a source region of the transistor. The second doped region 102 may be coupled to a capacitor or a memory element (such as the memory element 34 shown in FIG. 4) and the first doped region 101 may be coupled to a bit-line (such as the bit-line structure 32 shown in FIG. 4). The transistor may retain charge in the capacitor.

In some embodiments, the upper gate electrode 12e2 may have a low work function. In some embodiments, the lower gate electrode 12e1 may have a high work function. The high work function refers to a work function higher than a mid-gap work function of silicon. A low work function refers to a work function lower than the mid-gap work function of silicon. Specifically, the high work function may be higher than 4.5 eV, and the low work function may be lower than 4.5 eV.

The capping layer 12c may be disposed on the upper gate electrode 12e2. The capping layer 12c may contact the surface 12d1s of the second dielectric layer 12d1. The capping layer 12c may be spaced apart from the substrate 10 by the second dielectric layer 12d1. The capping layer 12c may serve to protect the upper gate electrode 12e2. The capping layer 12c may have a surface substantially coplanar with the top surface of the active region 10a.

In some embodiments, the capping layer 12c may include a dielectric material, such as silicon oxide ($SiO_2$), silicon nitride ($Si_3N_4$), silicon oxynitride ($N_2OSi_2$), and silicon nitride oxide ($N_2OSi_2$). In some embodiments, the capping layer 12c may include a silicon nitride liner and a spin-on-dielectric (SOD) material.

The gate structure 11 may include second and first dielectric layers 11d1, 11d2, lower and upper gate electrodes 11e1, 11e2, a first barrier layer 11b2 and a capping layer 11c. The gate structure 11 has a structure similar to the structure of the gate structure 12, except that the gate structure 11 is disposed in the isolation region 10i.

Referring to FIG. 1C, the trench 10t2 extends through one of the active regions 10a and the isolation region 10i. The trench 10t2 may have a fin structure in which the active region 10a protrudes more than the isolation region 10i. In other words, a depth of the passing gate, which runs across the isolation region 10i, is greater than a depth of the main gate, which runs across active region 10a. Accordingly, the trench 10t2 for the gate structure 12 has different depths for a main gate region and a passing gate region.

The fin structure may increase the channel width and improve the electrical characteristics. In some embodiments, the fin structure may be omitted.

Figure 2A:
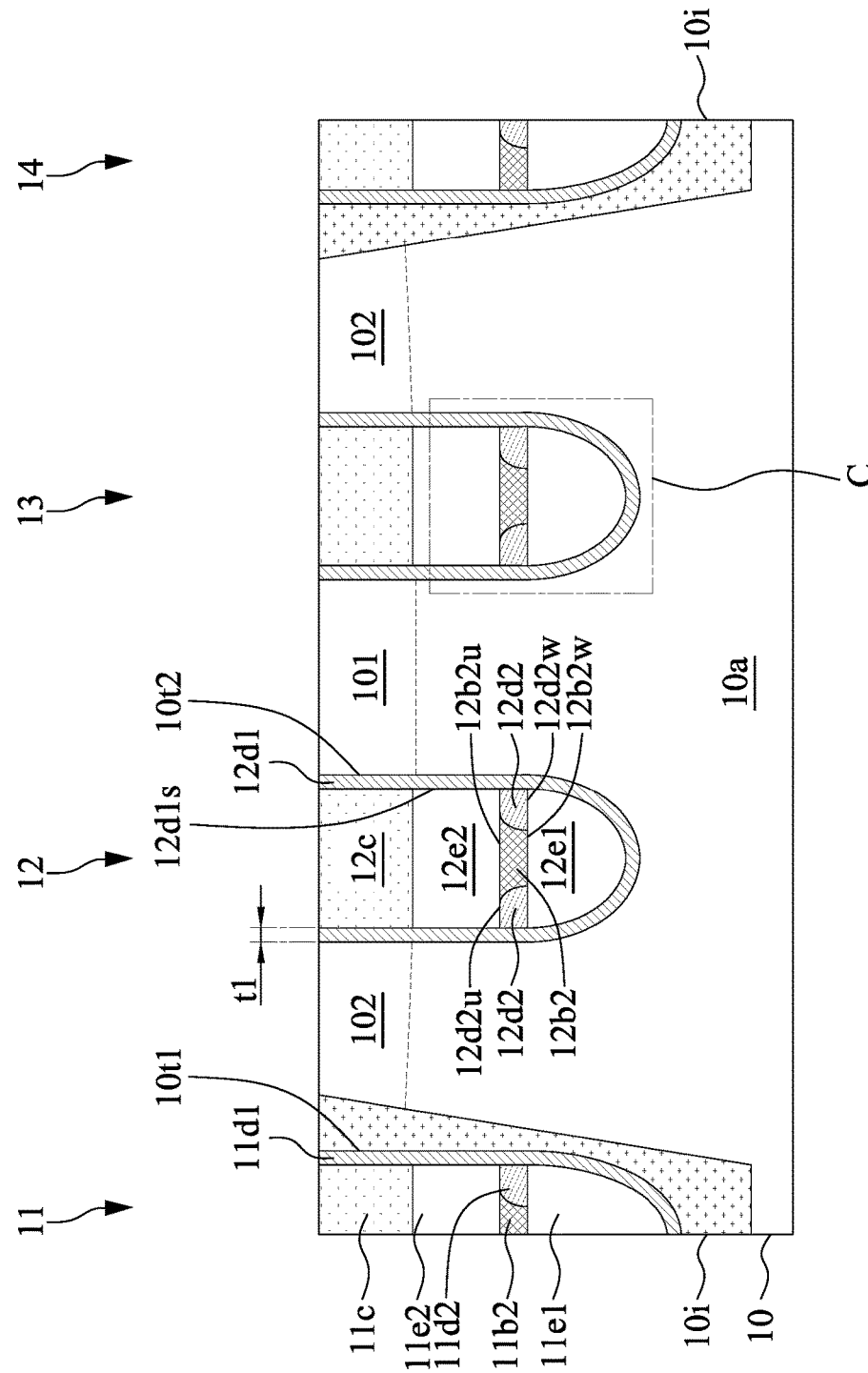
FIG. 2A is a schematic cross-sectional view of a semiconductor device in accordance with some embodiments of the present disclosure.
Figure 2B:
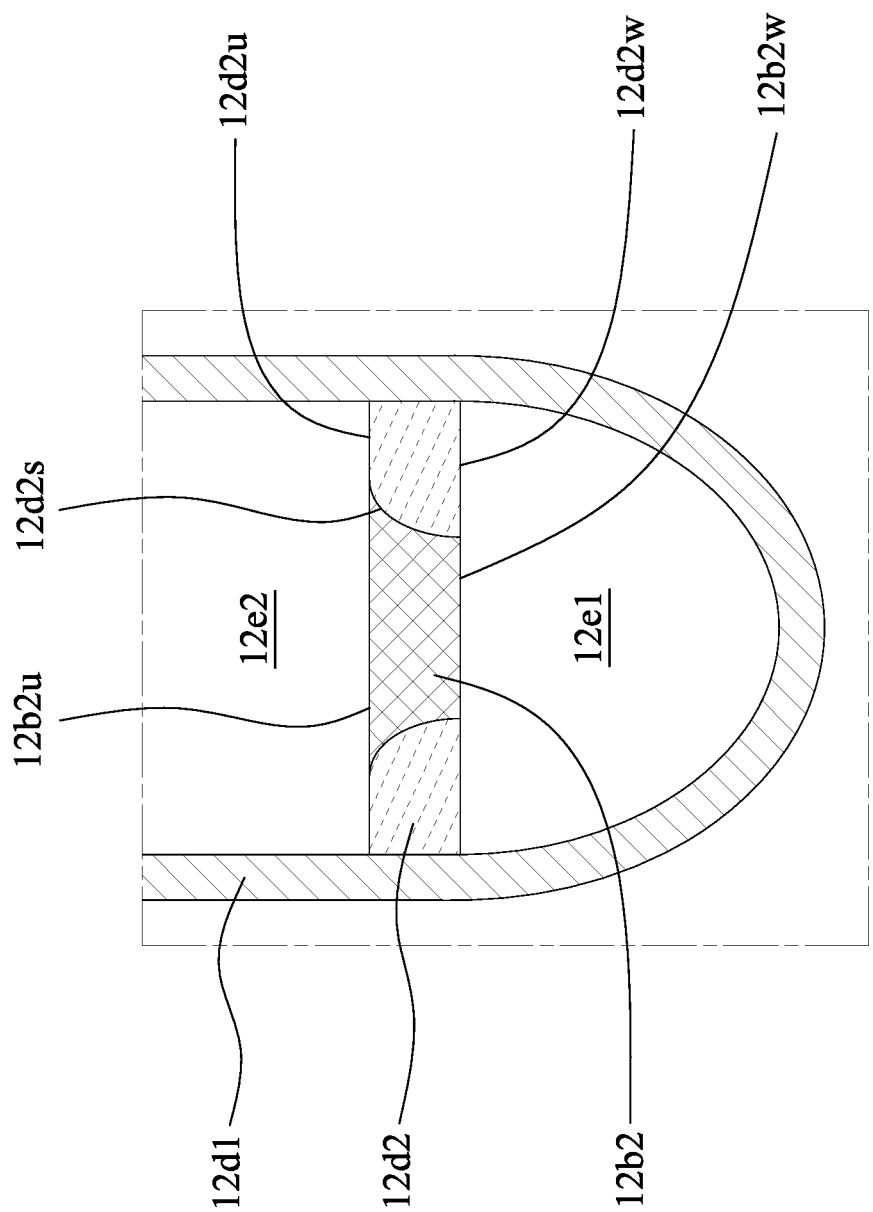
FIG. 2B is an enlarged view of a portion of the semiconductor device shown in FIG. 2A in accordance with some embodiments of the present disclosure.

FIG. 2A is a schematic cross-sectional view of a semiconductor device 2 in accordance with some embodiments of the present disclosure. FIG. 2B is an enlarged view of a portion of the semiconductor device 2 in the dotted box C in accordance with some embodiments of the present disclosure. The semiconductor device 2 of FIG. 2A is similar to the semiconductor device 1 of FIG. 1B, except for the differences described below.

The first dielectric layer 12d2 of the semiconductor device 2 has a curved surface 12d2s extending between the upper surface 12d2u and the lower surface 12d2w. For example, the curved surface 12d2s may have a smoothly bending shape. For example, the curved surface 12d2s may have a rounded shape.

The curved surface 12d2s may be covered by the first barrier layer 12b2. For example, an interface between the first barrier layer 12b2 and the first dielectric layer 12d2 may be curved. For example, a part of the first barrier layer 12b2 may be located between the first dielectric layer 12d2 and the upper gate electrode 12e2 in a direction substantially perpendicular to the top surface of the active region 10a.

For example, a width of the first barrier layer 12b2 may be tapered from the upper gate electrode 12e2 to the lower gate electrode 12e1. For example, a width of the first barrier layer 12b2 may be varied. For example, a width of the first barrier layer 12b2 proximal to the top surface of the active region 10a may be greater than a width of the first barrier layer 12b2 distal from the top surface of the active region 10a.

Figure 3:
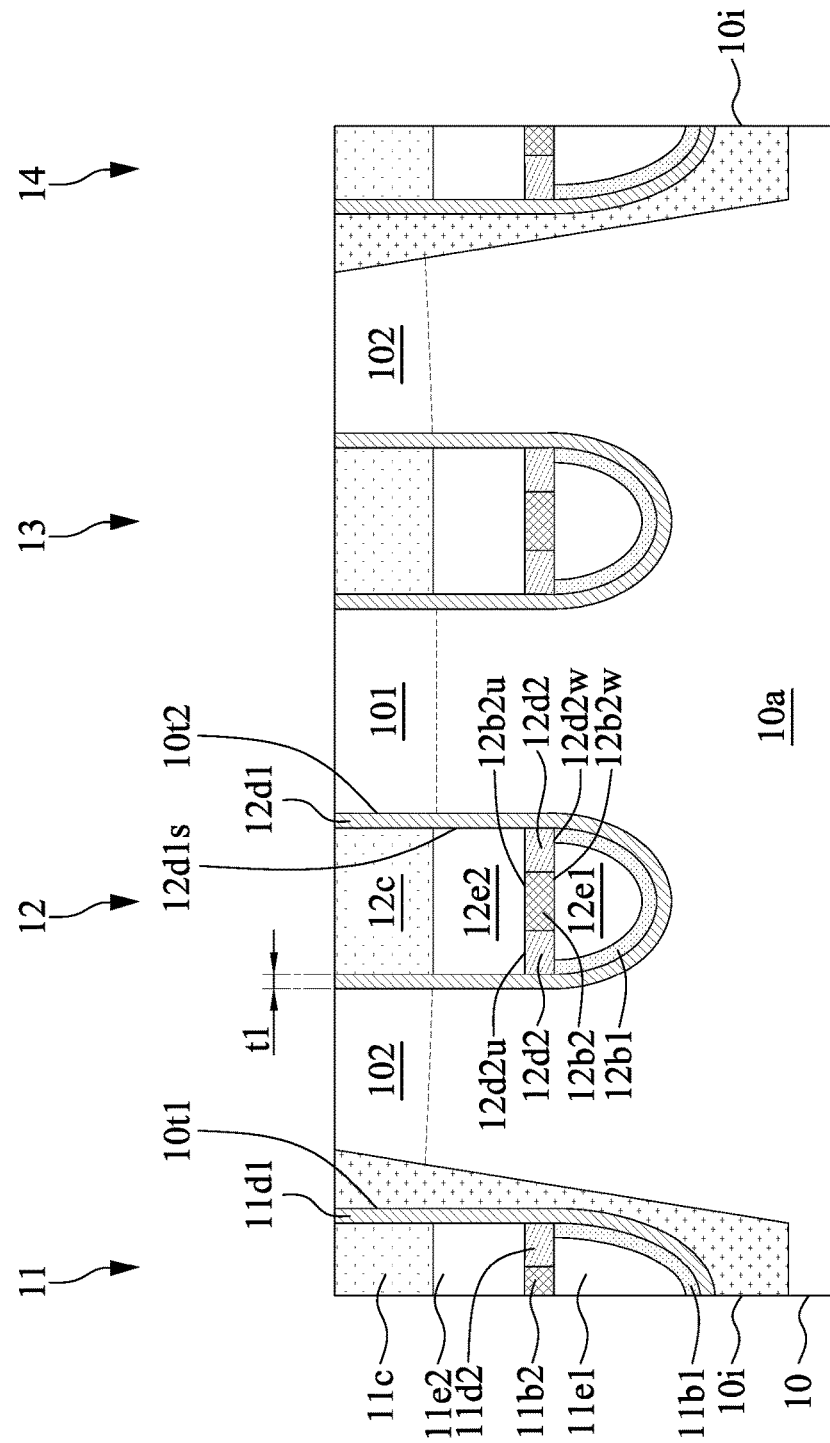
FIG. 3 is a schematic cross-sectional view of a semiconductor device in accordance with some embodiments of the present disclosure.

FIG. 3 is a schematic cross-sectional view of a semiconductor device 3 in accordance with some embodiments of the present disclosure. The semiconductor device 3 of FIG. 3 is similar to the semiconductor device 1 of FIG. 1B, except for the differences described below.

The gate structure 12 of the semiconductor device 3 further includes a second barrier layer 12b1
disposed between the second dielectric layer 12d1 and the lower gate electrode 12e1. The second barrier layer 12b1 may be conformally formed on the surface of the second dielectric layer 12d1. The lower surface 12d2w of the first dielectric layer 12d2 may contact the second barrier layer 12b1.

The first barrier layer 12b2 may be spaced apart from the second barrier layer 12b1. The first barrier layer 12b2 and the second barrier layer 12b1 may be spaced apart from the substrate 10 by different distances.

The second and first barrier layers 12b1 and 12b2 may be formed of the same material or different materials. In some embodiments, the second barrier layer 12b1 may include a metal-based material. The second barrier layer 12b1 may include metal nitride. The second barrier layer 12b1 may include titanium nitride (TiN) or tantalum nitride (TaN).

Figure 4:
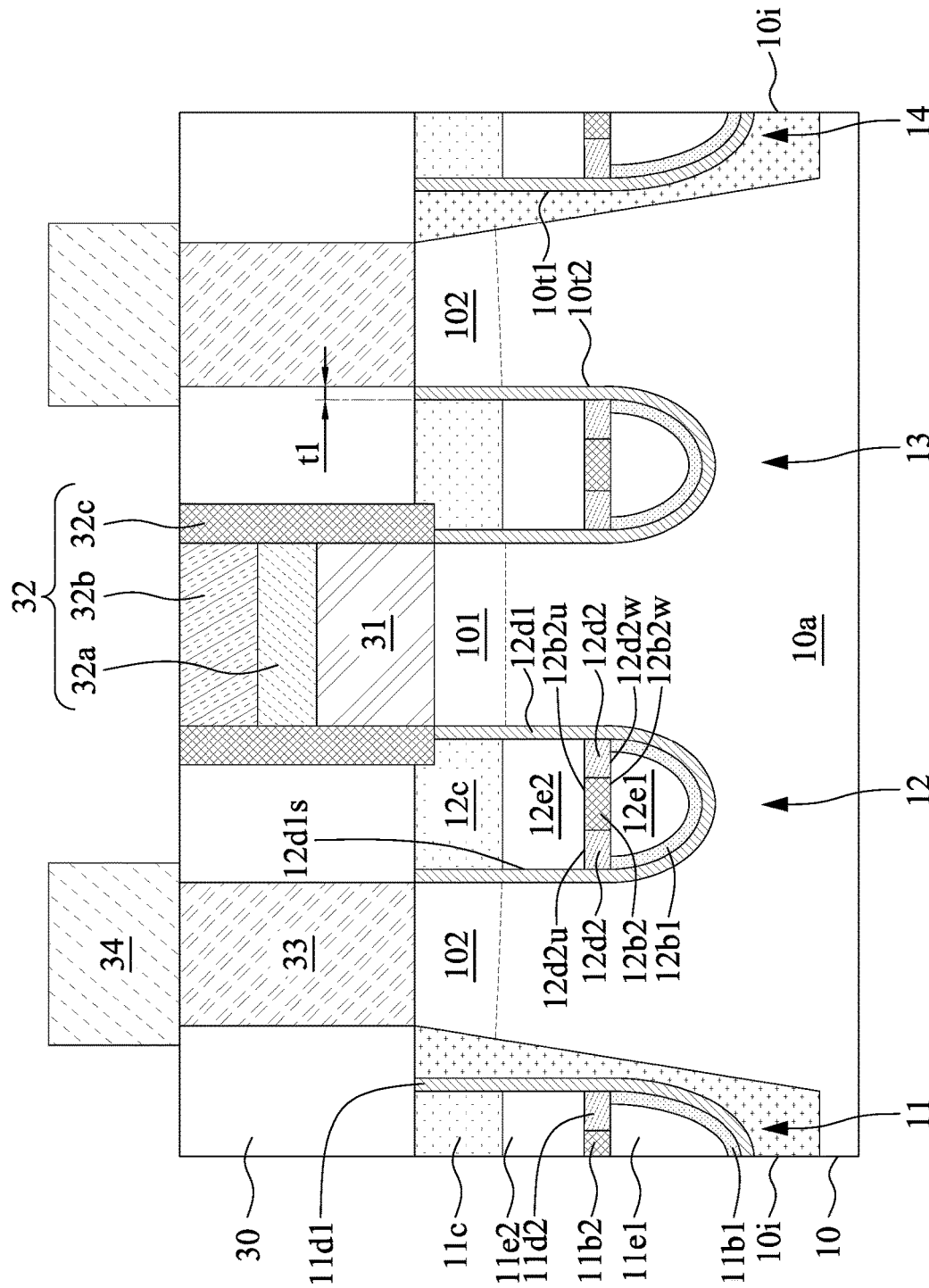
FIG. 4 is a schematic cross-sectional view of a semiconductor device in accordance with some embodiments of the present disclosure.

FIG. 4 is a schematic cross-sectional view of a semiconductor device 4 in accordance with some embodiments of the present disclosure. The semiconductor device 4 of FIG. 4 is similar to the semiconductor device 1 of FIG. 1B, except for the differences described below.

The semiconductor device 4 may further include an isolation layer 30, contact plugs 31, 33, a bit-line structure 32, and a memory element 34.

The isolation layer 30 may be a single layer or multiple layers. The isolation layer 30 may include silicon oxide ($SiO_2$), silicon nitride ($Si_3N_4$), silicon oxynitride ($N_2OSi_2$), silicon nitride oxide ($N_2OSi_2$), etc. The isolation layer 30 may serve to isolate adjacent contact plugs 33 from each other.

The contact plug 31 may be electrically connected with the bit-line structure 32 and the first doped region 101. The bit-line structure 32 may include a bit-line 32a, a bit line hard mask layer 32b and a spacer 32c. The bit-line 32a may include at least one material selected from a polysilicon (poly-Si), a metal silicide, a metal nitride and a metal. The bit line hard mask layer 32b may include a silicon oxide or a silicon nitride. The spacer 32c may include a dielectric material.

The contact plug 33 may be electrically connected with the memory element 34 and the second doped region 102.

In some embodiments, the contact plugs 31 and 33 may include a suitable conductive material. For example, the contact plugs 31 and 33 may include tungsten (W), copper (Cu), aluminum (Al), silver (Ag), an alloy thereof, or a combination thereof.

The memory element 34 may be a capacitor. Accordingly, the memory element 34 may include a storage node which contacts the contact plug 33. The storage node may have a cylinder shape or a pillar shape. A capacitor dielectric layer may be formed on the surface of the storage node.

In a conventional process, during an etch-back operation on a barrier layer (such as the operation illustrated in FIG. 5J), the gate dielectric layer or the sidewall dielectric (such as the second dielectric layers 12d1) of the buried gate structure (such the gate structure 12) may be inevitably consumed and the effective electric field near the gate electrode (such as an electrode of the gate structure 12) may become higher. This causes GIDL to occur.

Forming a protection layer (such as the first dielectric layer 12d2) before disposing a barrier layer (such as the first barrier layer 12b2) can prevent the gate dielectric layer or the sidewall dielectric (such as the second dielectric layers 12d1) from been damaged or consumed. Therefore, the effective electric field can be reduced and, consequently, GIDL can be reduced. A data retention time can be extended, and the operational reliability of the semiconductor device can also be improved.

In addition, a residual portion of the protection layer may be adjacent to the barrier layer. By using a protection layer having a low dielectric constant (such as lower than the dielectric constant of the sidewall dielectric), the effective electric field between the lower gate electrode and the upper gate electrode can be further decreased, which helps to mitigate GIDL while maintaining good device performance.

FIGS. 5A, 5B, 5C, 5D, 5E, 5F, 5G, 5H, 5I, 5J, 5K, 5L, 5M, 5N, 5O and 5P illustrate stages of a method of manufacturing a semiconductor device in accordance with some embodiments of the present disclosure. At least some of these figures have been simplified for a better understanding of the aspects of the present disclosure. In some embodiments, the semiconductor device 4 in FIG. 4 may be manufactured by the operations described below with respect to FIGS. 5A, 5B, 5C, 5D, 5E, 5F, 5G, 5H, 5I, 5J, 5K, 5L, 5M, 5N, 5O and 5P.

Figure 5A:
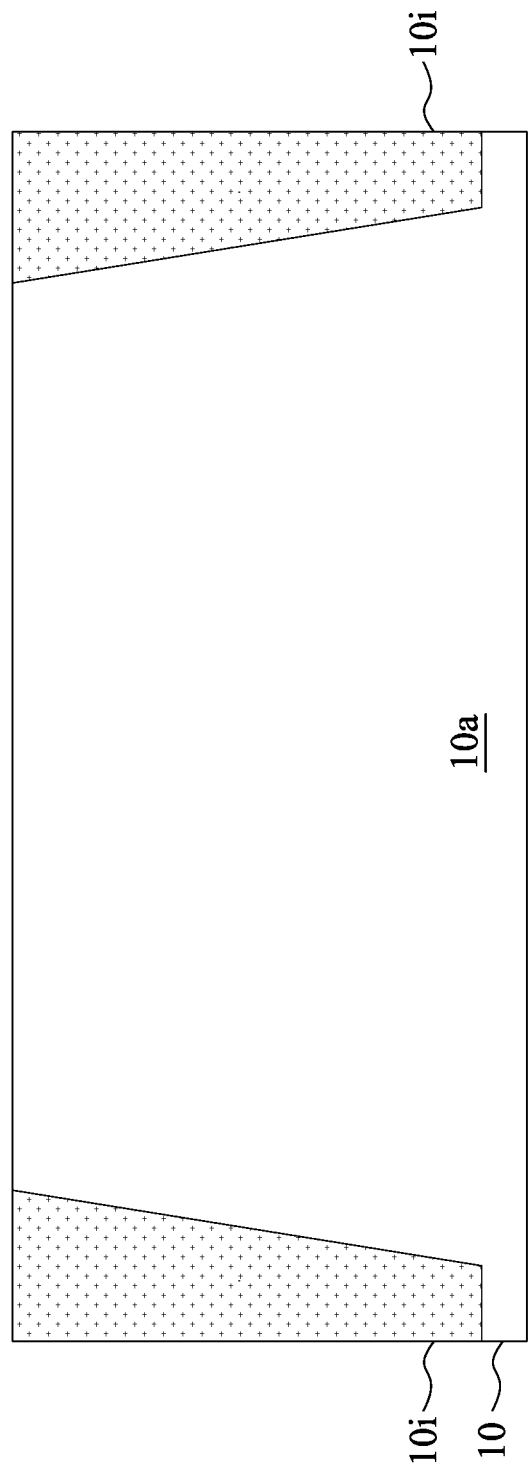
FIG. 5A illustrates one or more stages of a method of manufacturing a semiconductor device in accordance with some embodiments of the present disclosure.

As shown in FIG. 5A, the isolation region 10i is formed in the substrate 10. The active region 10a is defined by the isolation region 10i. The isolation region 10i may be formed through an STI (shallow trench isolation) process. For example, after a pad layer (not shown) is formed on the substrate 10, the pad layer and the substrate 10 are etched using an isolation mask (not shown) to define an isolation trench. The isolation trench is filled with a dielectric material, and accordingly, the isolation region 10i is formed.

A wall oxide, a liner and a gap-fill dielectric may be sequentially formed as the isolation region 10i. The liner may be formed by stacking silicon oxide ($SiO_2$) and silicon nitride ($Si_3N_4$). The gap-fill dielectric may include a SOD material. In another embodiment of the present invention, in the isolation region 10i, a silicon nitride may be used as the gap-fill dielectric. The isolation trench may be filled with a dielectric material through a chemical vapor deposition (CVD) process. Also, a planarization process such as chemical-mechanical polishing (CMP) may be additionally performed.

Figure 5B:
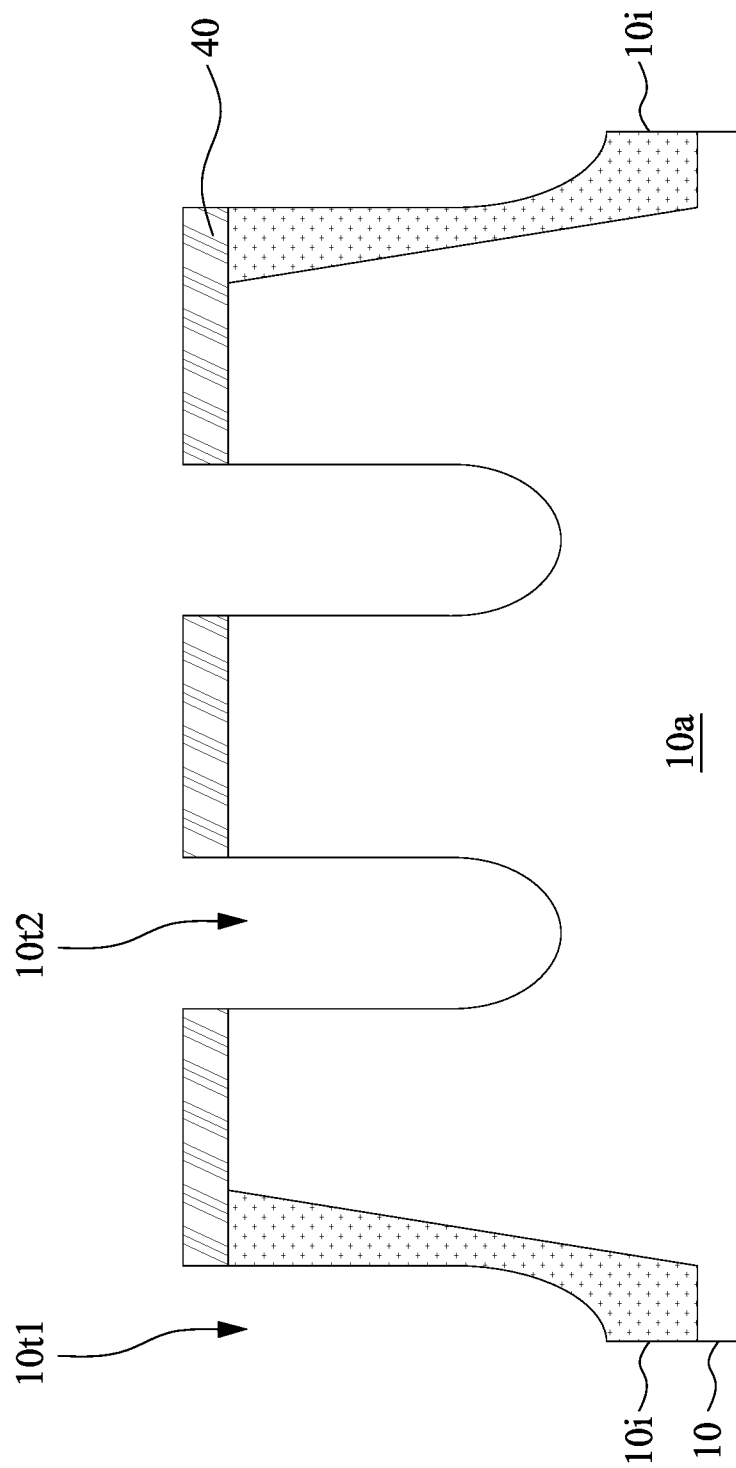
FIG. 5B illustrates one or more stages of a method of manufacturing a semiconductor device in accordance with some embodiments of the present disclosure.

Referring to FIG. 5B, a plurality of trenches 10t1 and 10t2 may then be formed in the substrate 10. Each of the trenches 10t1 and 10t2 may have a line shape crossing the active region 10a and the isolation region 10i. Each of the trenches 10t1 and 10t2 may be formed by an etch process of the substrate 10 using a hard mask layer 40 as an etch mask. The hard mask layer 40 may be formed on the substrate 10, and have line-shaped openings. The hard mask layer 40 may be formed of a material having an etch selectivity to the substrate 10. Each of the trenches 10t1 and 10t2 may be formed to be shallower than the isolation trench. In some embodiments, the bottom edge of each of the trenches 10t1 and 10t2 may have a curvature.

The active region 10a and the isolation region 10i may be simultaneously etched to form the trenches 10t1 and 10t2. In some embodiments, the isolation region 10i is more deeply etched than the active region 10a due to an etch selectivity between the active region 10a and the isolation region 10i. Therefore, the gate trench may have a fin structure in which the active region 10a protrudes further than the isolation region 10i in the gate trench.

Figure 5C:
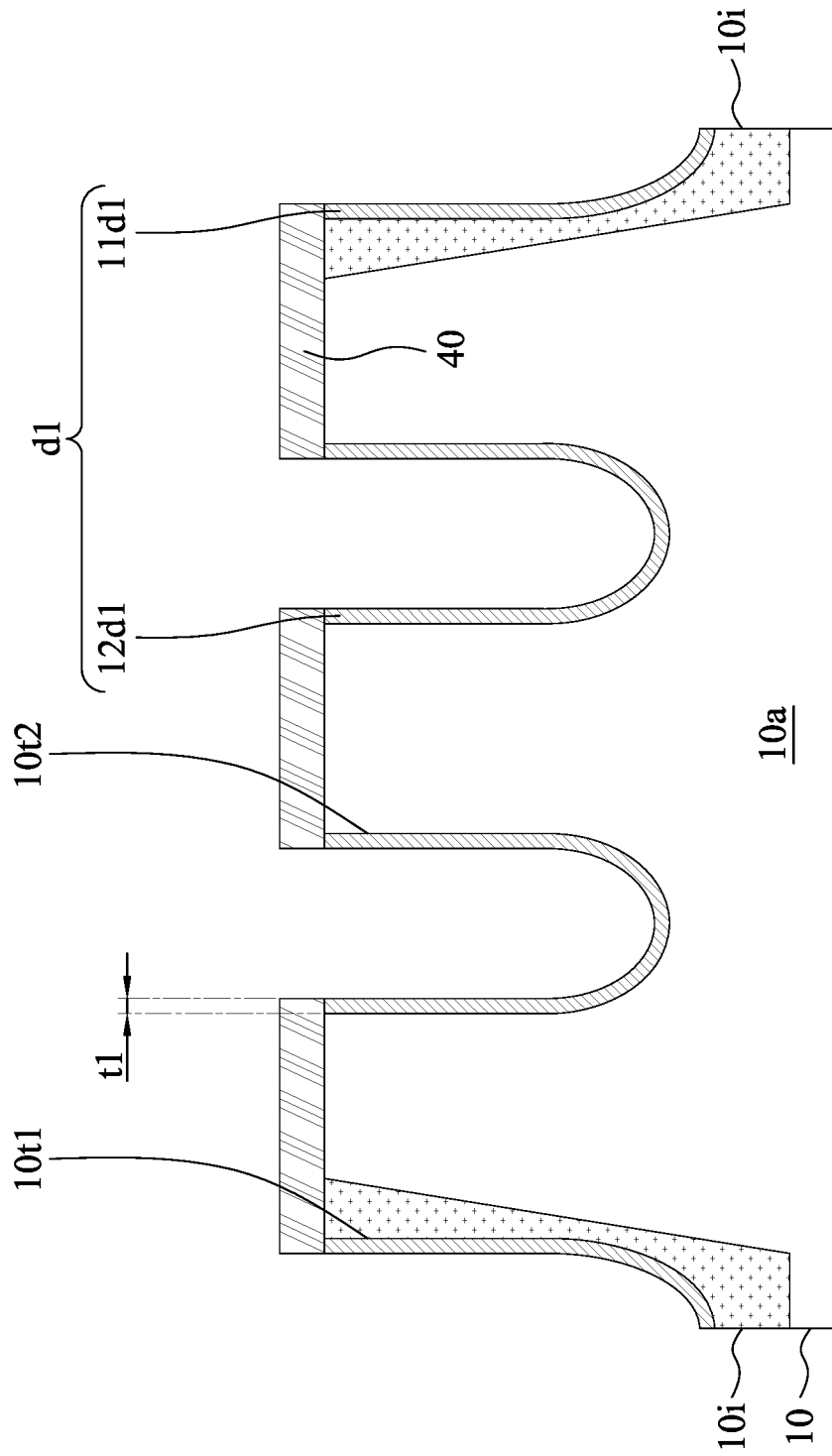
FIG. 5C illustrates one or more stages of a method of manufacturing a semiconductor device in accordance with some embodiments of the present disclosure.

Referring to FIG. 5C, a second dielectric material d1 may be formed on the surface of each of the trenches 10t1 and 10t2. Before the second dielectric material d1 is formed, the inside surface of each of the trenches 10t1 and 10t2 that is damaged from the etch process may be recovered. For example, sacrificial oxide may be formed by a thermal oxidation treatment, and then the sacrificial oxide may be removed.

The second dielectric material d1 may be formed by a thermal oxidation process. In some embodiments, the second dielectric material d1 may be formed by a deposition process, such as a CVD process or an ALD process.

Figure 5D:
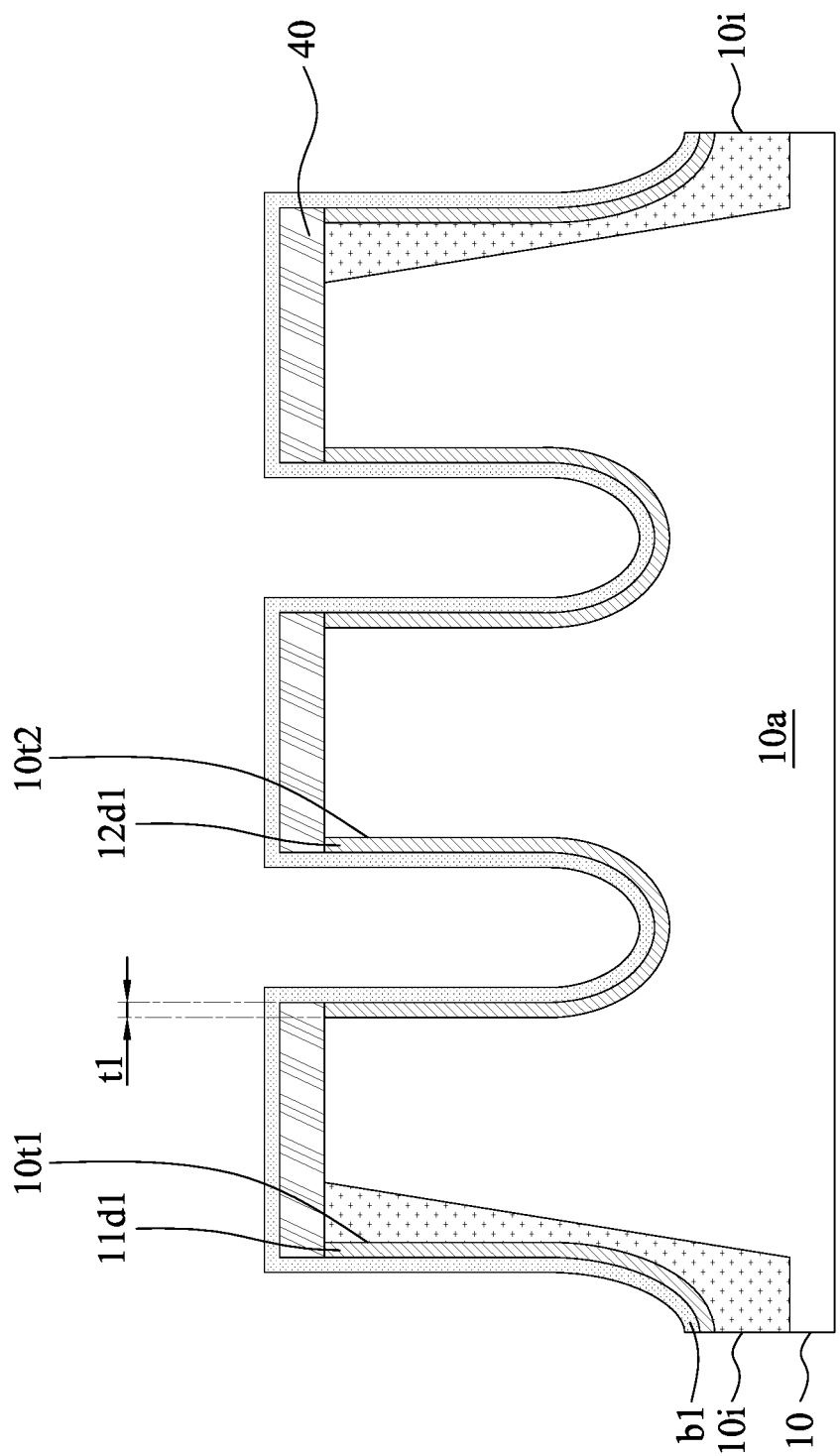
FIG. 5D illustrates one or more stages of a method of manufacturing a semiconductor device in accordance with some embodiments of the present disclosure.

Referring to FIG. 5D, a second barrier material b1 may be formed on the second dielectric material d1 and the hard mask layer 40. The second barrier material b1 may be conformally formed on the surface of the second dielectric material d1. The second barrier material b1 may be formed by the ALD or CVD process.

Figure 5E:
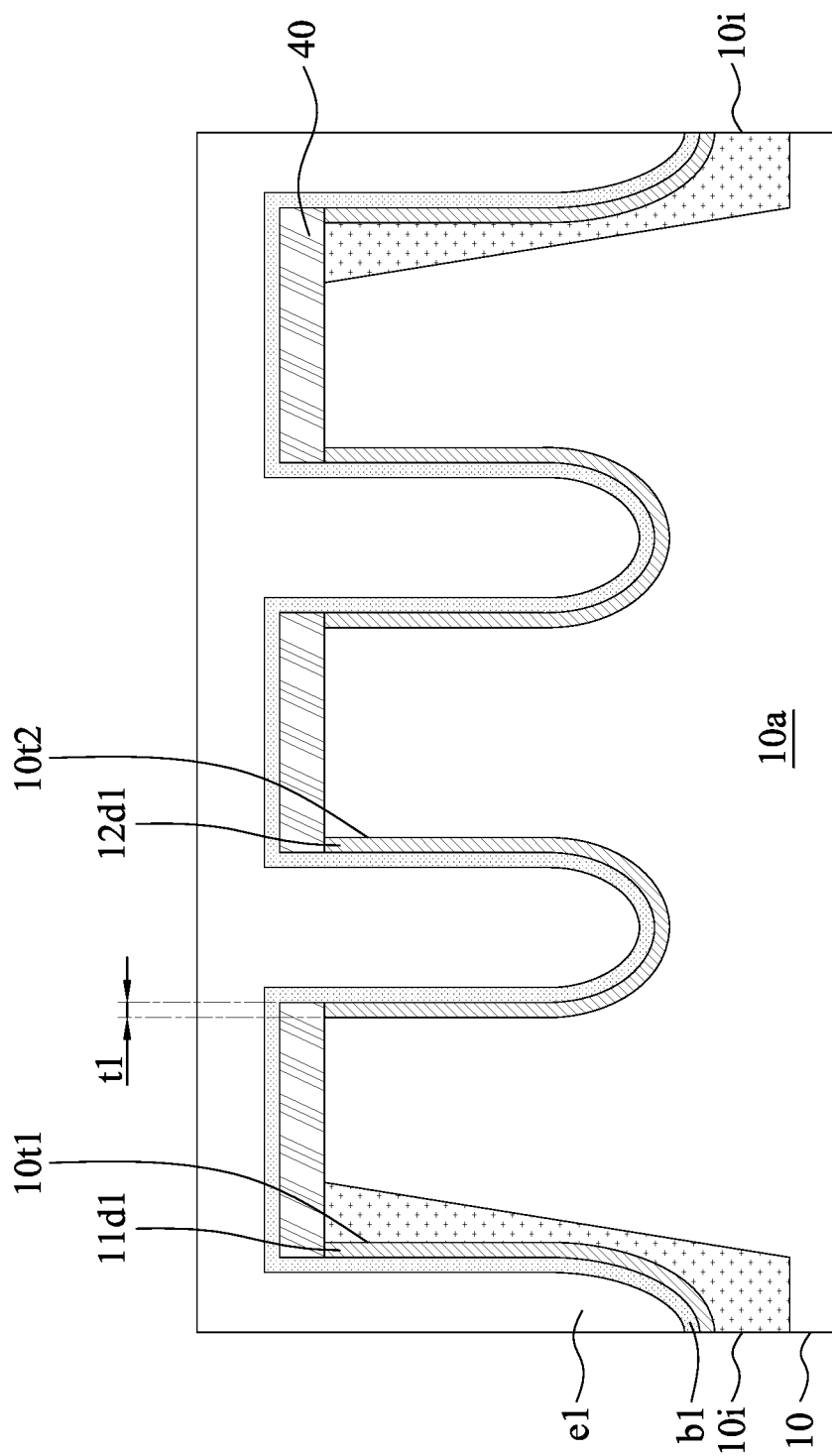
FIG. 5E illustrates one or more stages of a method of manufacturing a semiconductor device in accordance with some embodiments of the present disclosure.

Referring to FIG. 5E, a conductive layer e1 may be formed on the second barrier material b1. The conductive layer e1 may be formed on the second barrier material b1 to fill each of the trenches 10t1 and 10t2. The conductive layer e1 may include a low-resistance metal material. The conductive layer e1 may include tungsten (W). The conductive layer e1 may be formed by the CVD or ALD process.

Figure 5F:
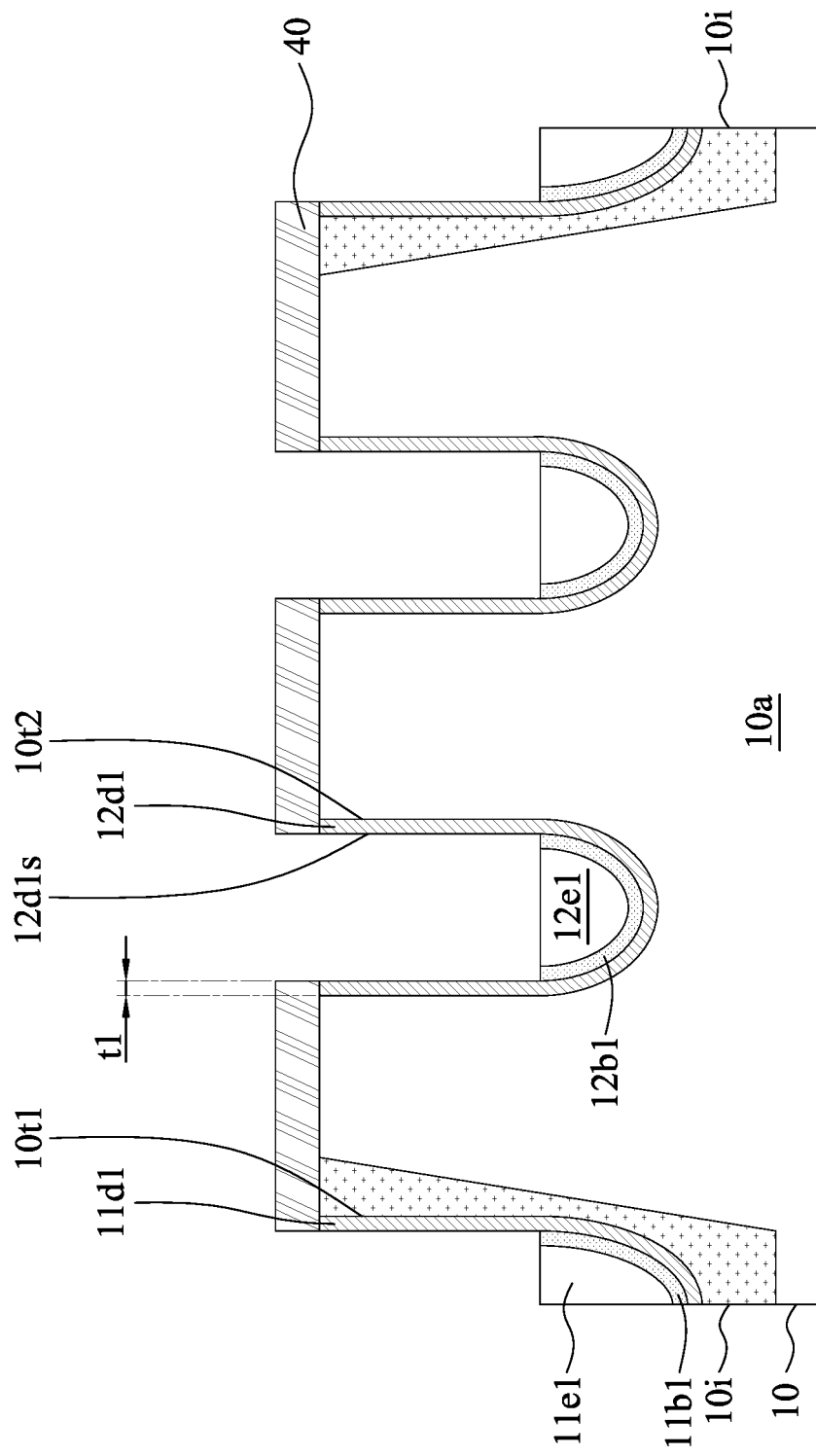
FIG. 5F illustrates one or more stages of a method of manufacturing a semiconductor device in accordance with some embodiments of the present disclosure.

Referring to FIG. 5F, a recessing process may be performed. The recessing process may be performed by a dry etch process, for example, an etch-back process. The second barrier layers 11b1 and 12b1 may be formed by performing the etch-back process on the second barrier material b1. The lower gate electrodes 11e1 and 12e1 may be formed by performing the etch-back process on the conductive layer e1.

The second barrier layer 11b1 and the lower gate electrode 11e1 may be formed inside the trench 10t1. The top surfaces of the second barrier layer 11b1 and the lower gate electrode 11e1 may be substantially coplanar or located at the same level. The second barrier layer 12b1 and the lower gate electrode 12e1 may be formed inside the trench 10t2. The top surfaces of the second barrier layer 12b1 and the lower gate electrode 12e1 may be substantially coplanar or located at the same level.

In some embodiments, a planarization process may be performed in advance to expose the top surface of the hard mask layer 40, and then the etch-back process may be performed.

After the second barrier layer 12b1 and the lower gate electrode 12e1 are formed, a surface 12d1s of the second dielectric layer 12d1 may be partially exposed.

Figure 5G:
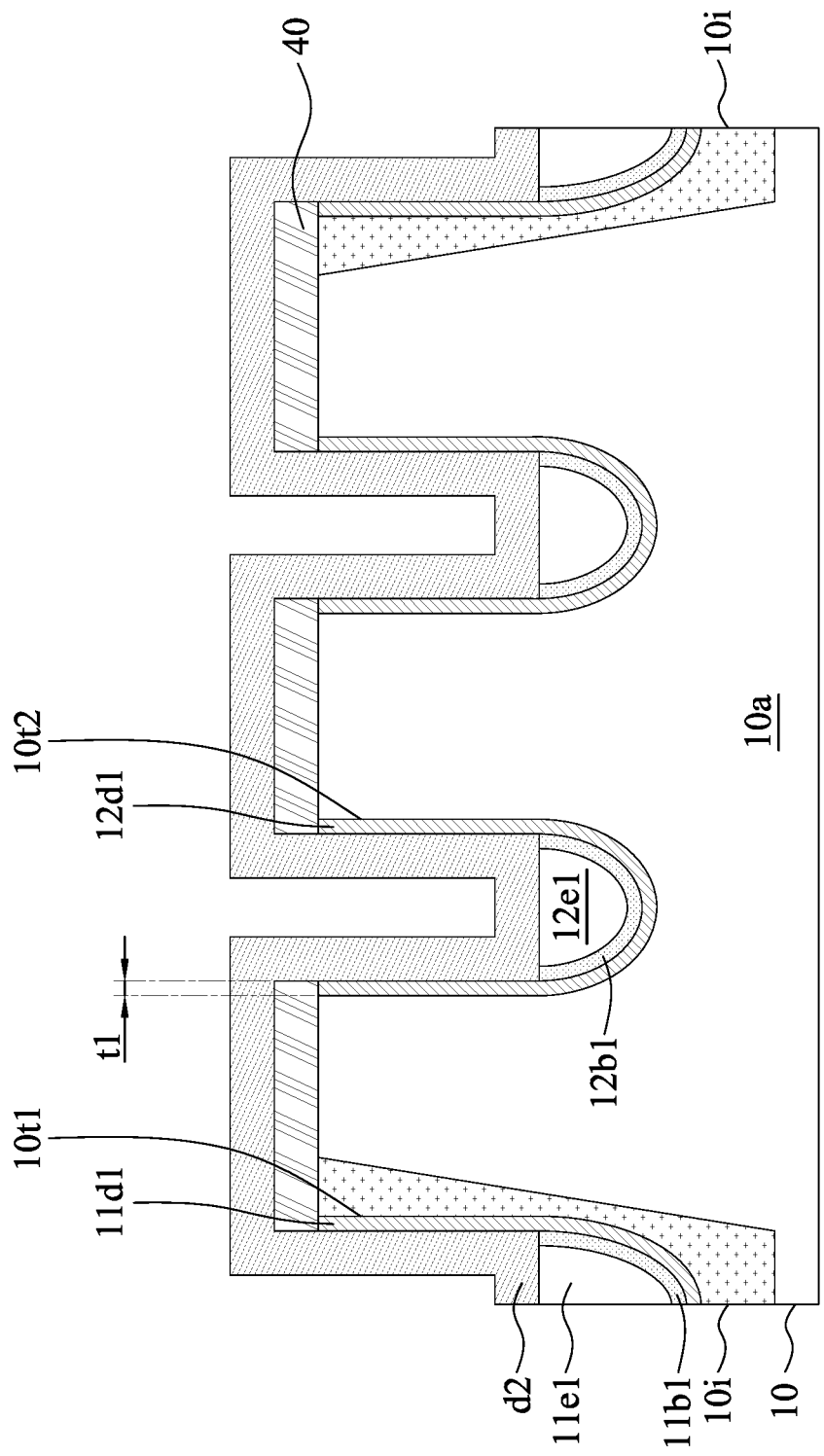
FIG. 5G illustrates one or more stages of a method of manufacturing a semiconductor device in accordance with some embodiments of the present disclosure.

Referring to FIG. 5G, a first dielectric material d2 may be formed on the second barrier layer 12b1 and the lower gate electrode 12e1. The first dielectric material d2 may directly contact the second barrier layer 12b1 and the lower gate electrode 12e1. The first dielectric material d2 may directly contact the surface 12d1s of the second dielectric layer 12d1. The first dielectric material d2 may be formed by ALD or CVD. In some embodiments, the thickness of the first dielectric material d2 may vary with the trench depth. For example, the first dielectric material d2 may be thicker in a deeper location.

Figure 5H:
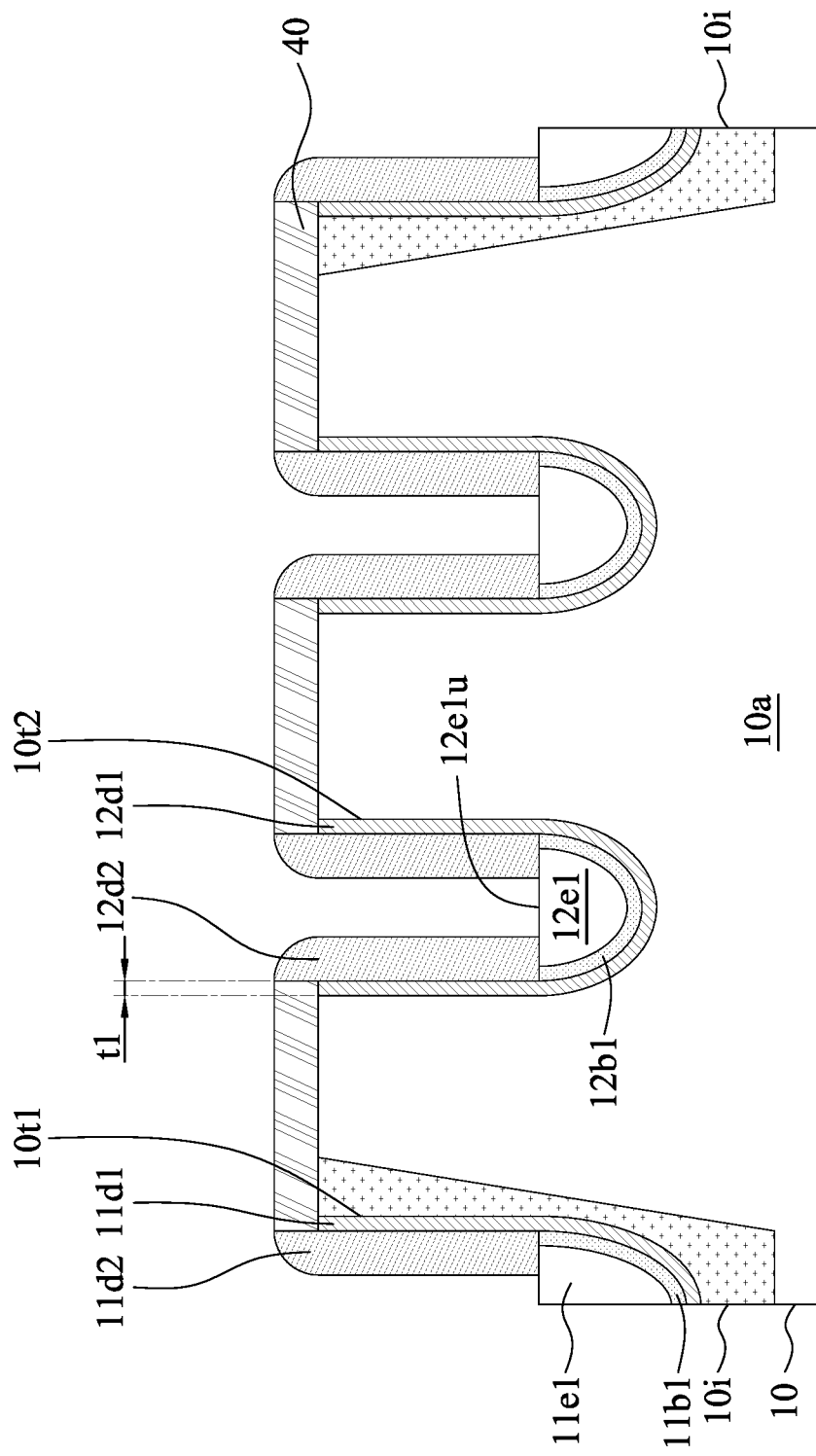
FIG. 5H illustrates one or more stages of a method of manufacturing a semiconductor device in accordance with some embodiments of the present disclosure.

Referring to FIG. 5H, a part of the first dielectric material d2 may be removed to expose a portion 12e1u of the lower gate electrode 12e1. In some embodiments, the first dielectric material d2 may be removed by anisotropic etching operation. The first dielectric layer 12d2 may be formed in the trench 12 and the first dielectric layer 11d2 may be formed in the trench 11. In some embodiments, the remained first dielectric material d2 may have a substantially vertical profile (shown in FIG. 1B) or a curved profile (shown in FIG. 2B).

Figure 5I:
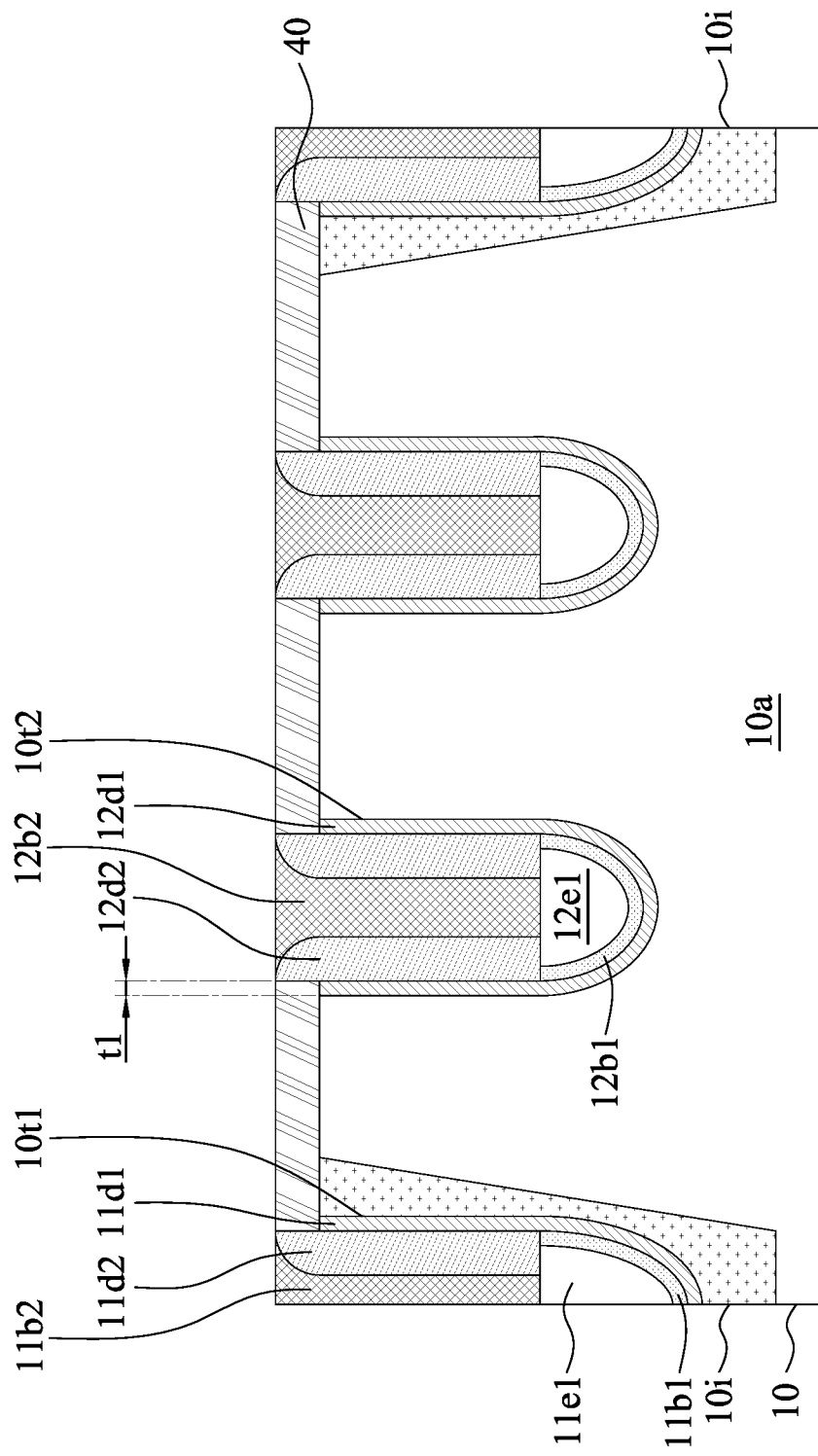
FIG. 5I illustrates one or more stages of a method of manufacturing a semiconductor device in accordance with some embodiments of the present disclosure.
Figure 5I:
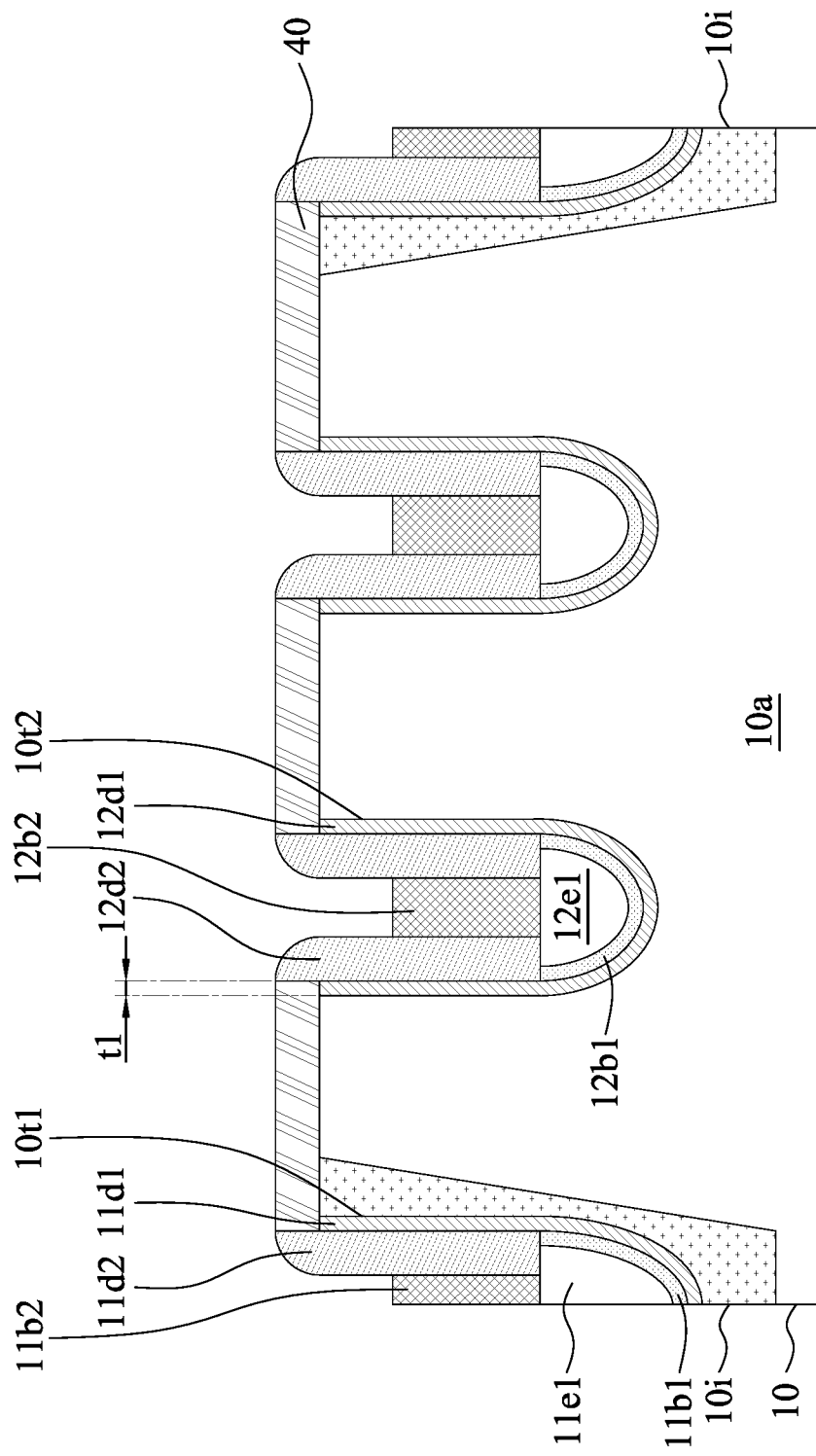

Referring to FIG. 5I, a first barrier layer 12b2 may be formed on the portion 12e1u of the lower gate electrode 12e1. The first barrier layer 12b2 may be formed by physical vapor deposition (PVD).

The first barrier layer 12b2 may fill up the trench 12. However, in some other embodiments, as shown in FIG. 5I', the first barrier layer 12b2 may not fill up the trench 12. The top surface of the first barrier layer 12b2 may be lower than the top surface of the first dielectric layer 12d2.

Figure 5J:
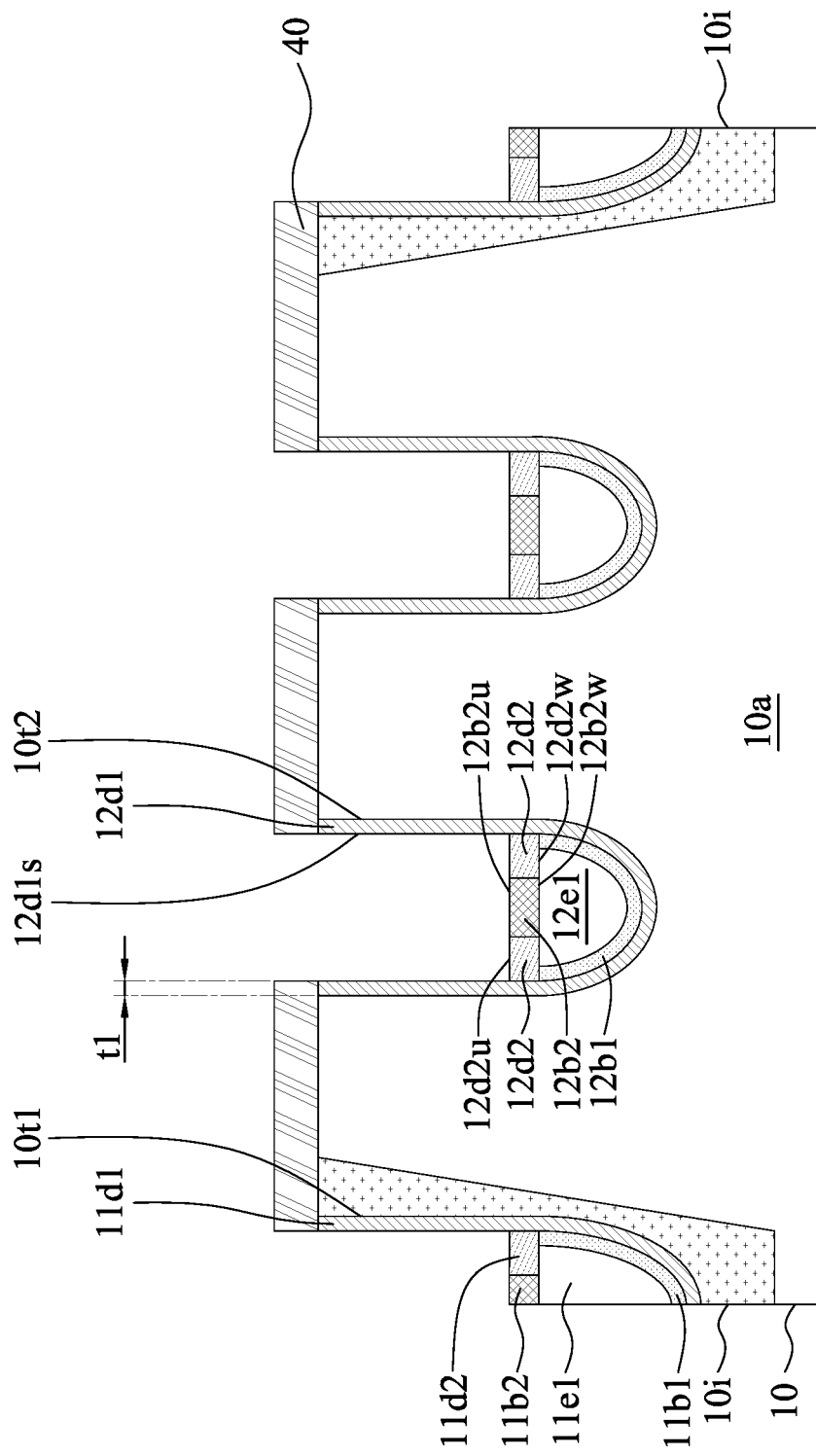
FIG. 5J illustrates one or more stages of a method of manufacturing a semiconductor device in accordance with some embodiments of the present disclosure.

Referring to FIG. 5J, a part of the first barrier layer 12b2 and a part of the first dielectric layer 12d2 may be removed to expose the surface 12d1s of the second dielectric layer 12d1. An upper surface 12d2u of the first dielectric layer 12d2 and an upper surface 12b2u of the first barrier layer 12b2 may be formed. The upper surface 12d2u and the upper surface 12b2u may be formed by performing the etch-back process on the first dielectric layer 12d2 and the first barrier layer 12b2.

During the etch-back operation, the first dielectric layer 12d2 may prevent the sidewall 12d1s of the second dielectric layer 12d1 from being etched, consumed or damaged. Therefore, the first dielectric layer 12d2 may serve as a protection layer or a passivation layer for the second dielectric layer 12d1.

Figure 5K:
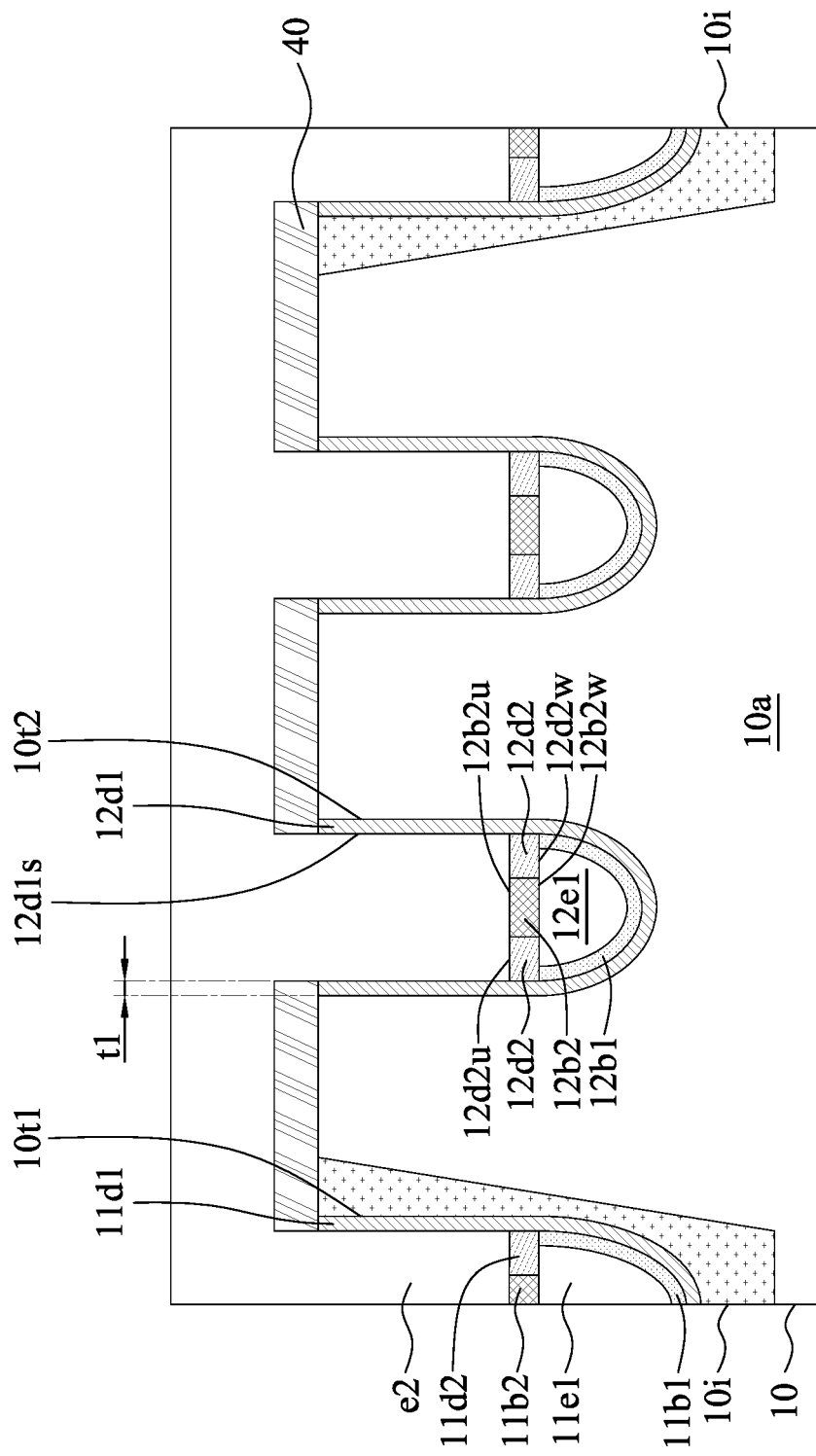
FIG. 5K illustrates one or more stages of a method of manufacturing a semiconductor device in accordance with some embodiments of the present disclosure.

Referring to FIG. 5K, a conductive layer e2 may be formed on the first barrier layer 11b2, the first dielectric layer 11d2, the first barrier layer 12b2 and the first dielectric layer 12d2. The conductive layer e2 may fill each trench. The conductive layer e2 may include a material having a low work function. The conductive layer e2 may include polysilicon having a low work function, for example, polysilicon doped with an N-type impurity. The conductive layer e2 may be formed by CVD or ALD.

Figure 5L:
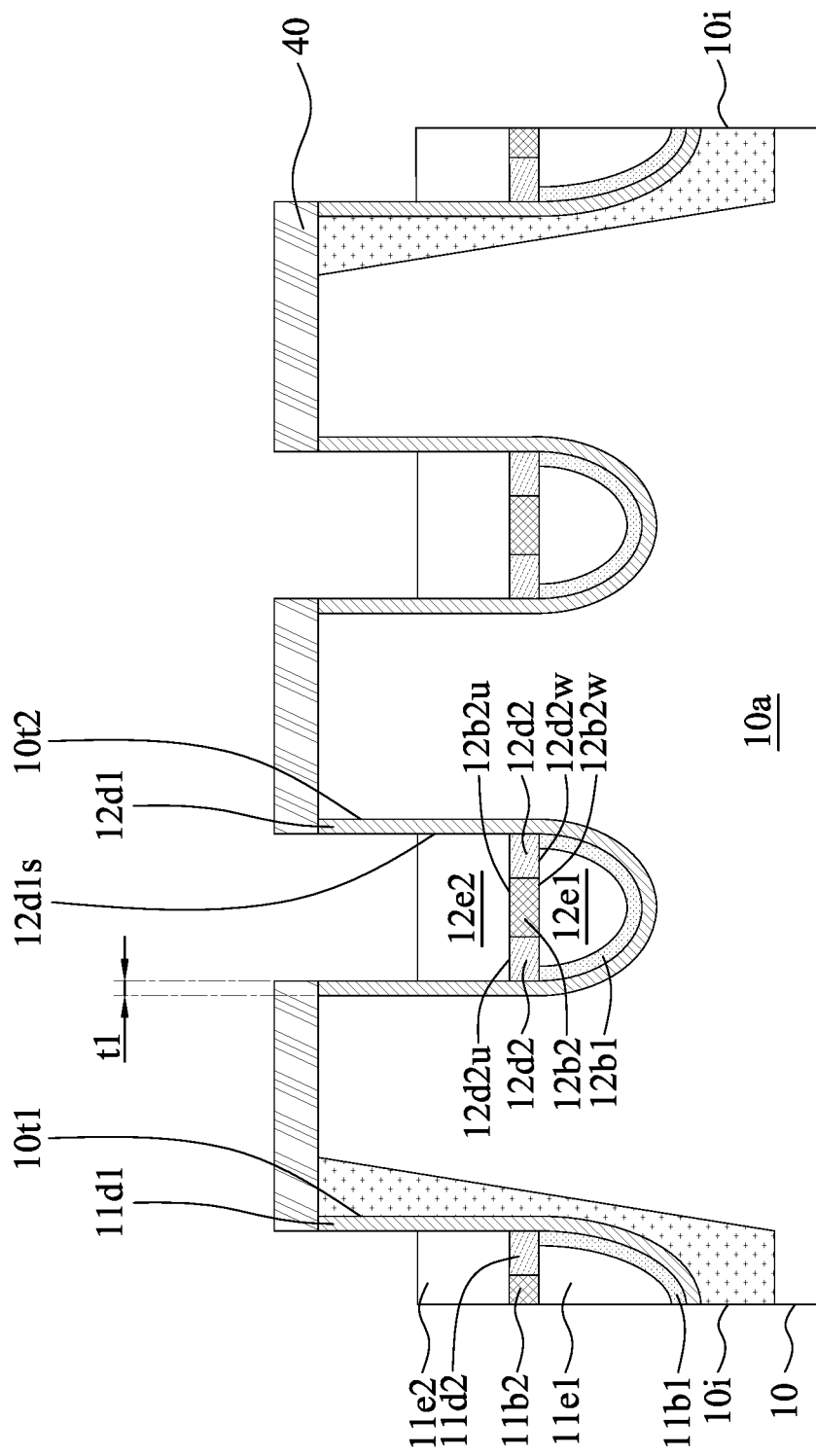
FIG. 5L illustrates one or more stages of a method of manufacturing a semiconductor device in accordance with some embodiments of the present disclosure.

Referring to FIG. 5L, a recessing process may be performed. The recessing process may be performed by a dry etch process, for example, an etch-back process. The upper gate electrodes 11e2 and 12e2 may be formed by performing the etch-back process on the conductive layer e2.

Figure 5M:
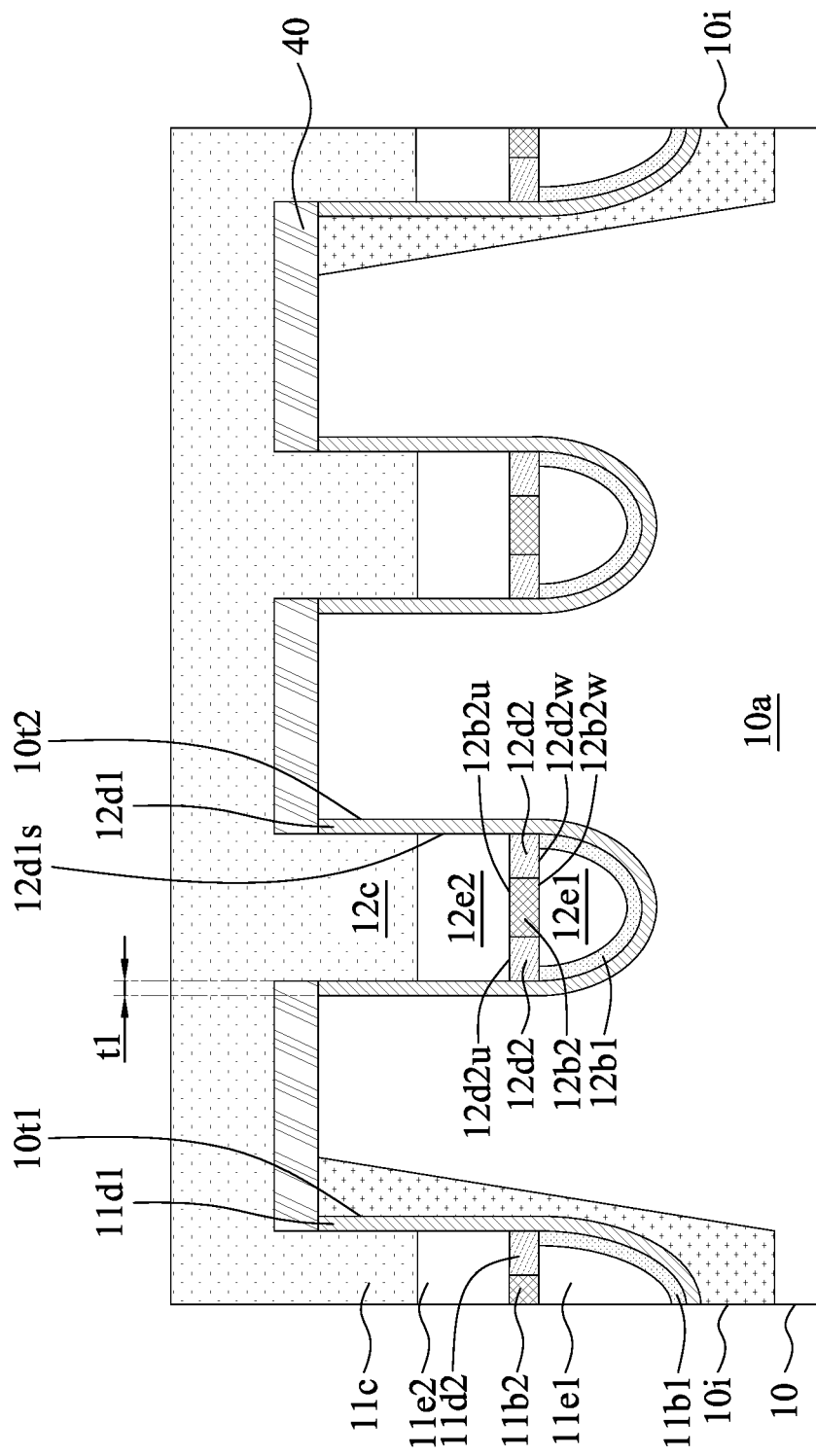
FIG. 5M illustrates one or more stages of a method of manufacturing a semiconductor device in accordance with some embodiments of the present disclosure.

Referring to FIG. 5M, the capping layers 11c and 12c may be formed on the upper gate electrodes 11e2 and 12e2.

Figure 5N:
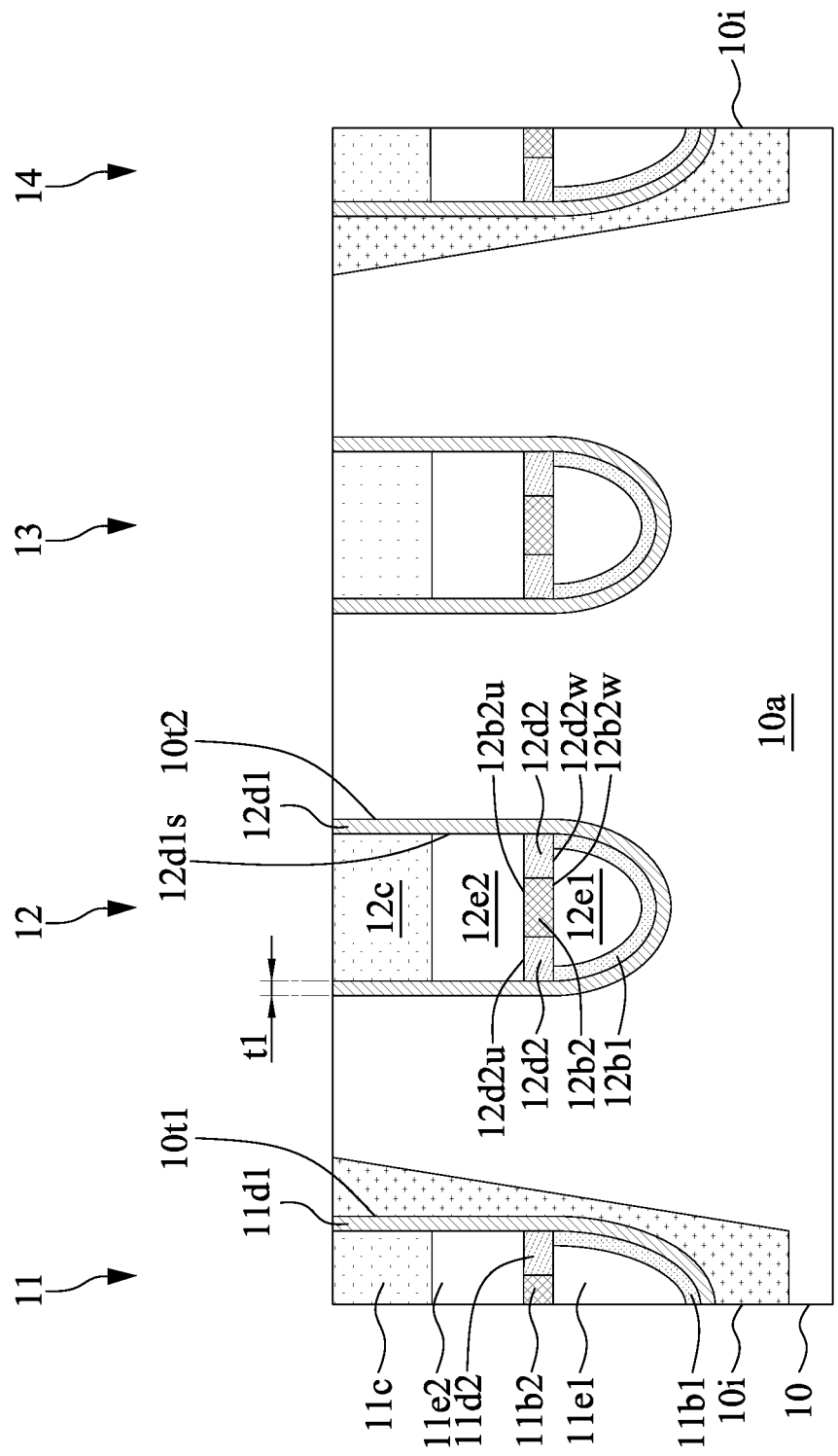
FIG. 5N illustrates one or more stages of a method of manufacturing a semiconductor device in accordance with some embodiments of the present disclosure.

Referring to FIG. 5N, the capping layer 24 may be planarized and the hard mask layer 40 may be removed so that the top surfaces of the second dielectric layers 11d1 and 12d1 are exposed. Through a series of processes described above, buried gate structures 11, 12, 13 and 14 may be formed.

Figure 5O:
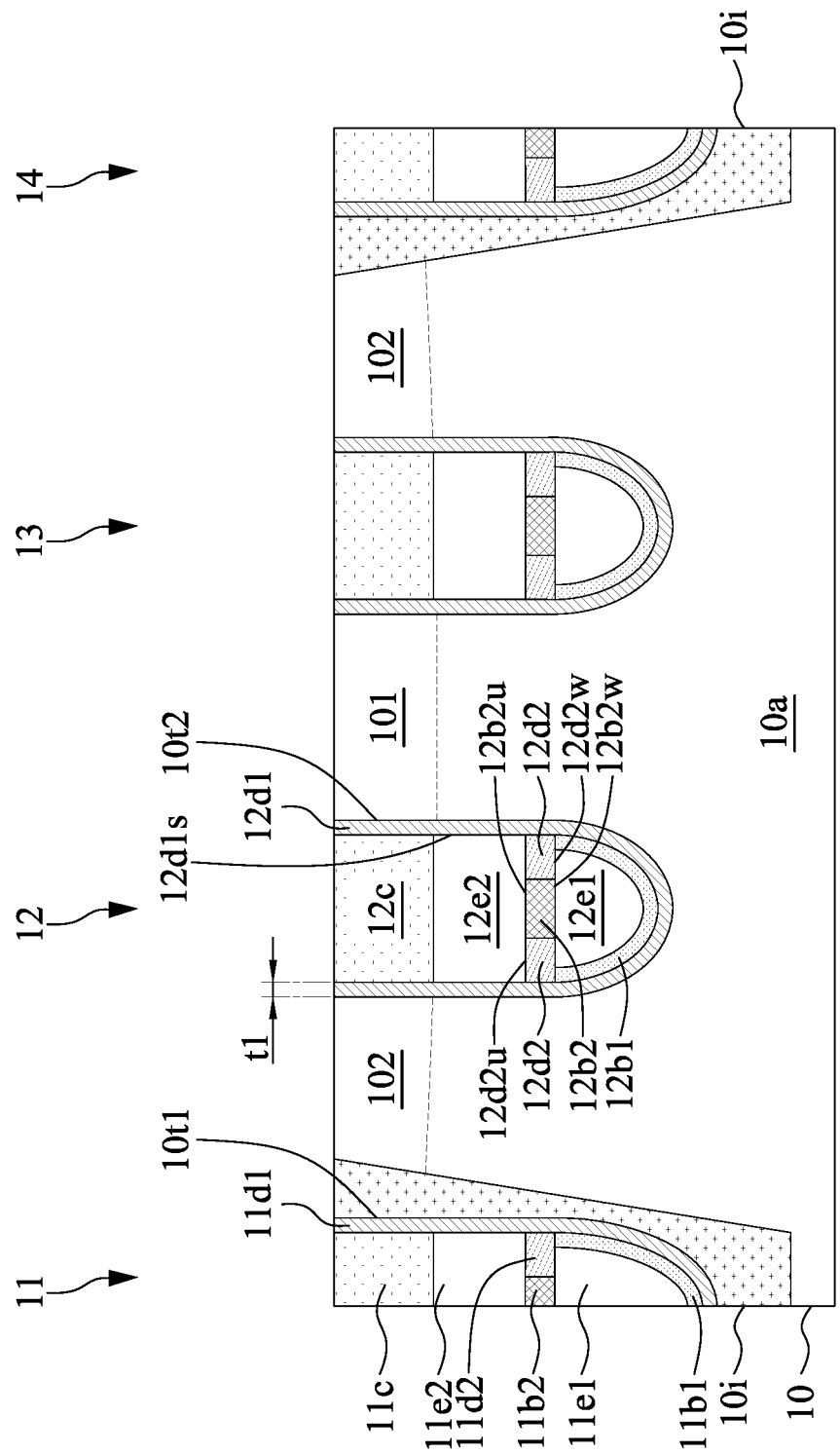
FIG. 5O illustrates one or more stages of a method of manufacturing a semiconductor device in accordance with some embodiments of the present disclosure.

Referring to FIG. 5O, a doping process of an impurity is performed by implantation or other doping technique. Accordingly, the first doped region 101 and second doped region 102 are formed in the substrate 10.

In some embodiments, the first doped region 101 and second doped region 102 may be formed subsequent to other operations described. For example, the first doped region 101 and second doped region 102 may be formed subsequent to one of the operations in FIGS. 5A, 5B, 5C, 5D, 5E, 5F, 5G, 5H, 5I, 5J, 5K, 5L, 5M and 5N.

Figure 5P:
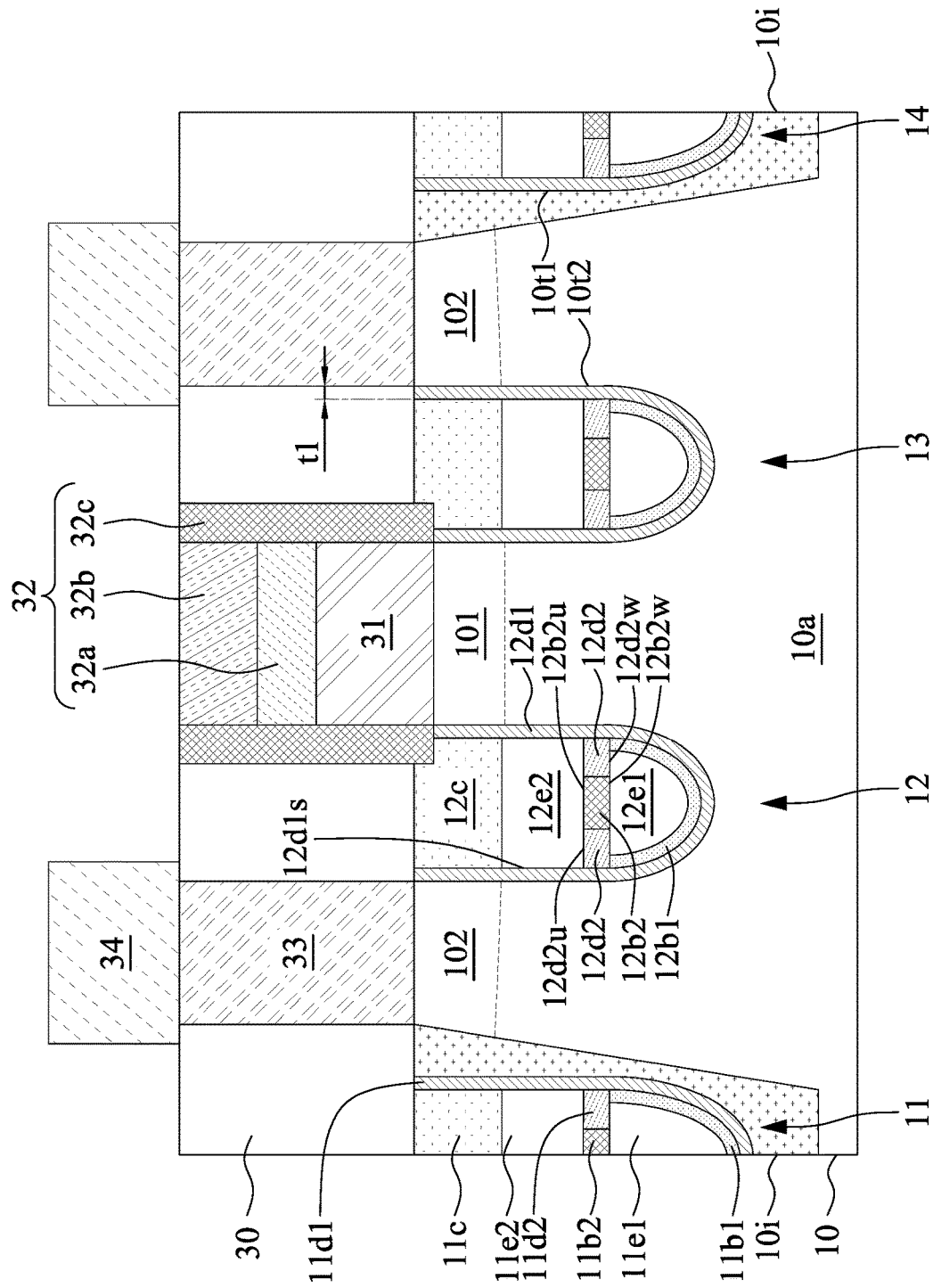
FIG. 5P illustrates one or more stages of a method of manufacturing a semiconductor device in accordance with some embodiments of the present disclosure.

Referring to FIG. 5P, the isolation layer 30 may be formed on the top surface of the structure from FIG. 4N by, for example, ALD, CVD, PVD, remote plasma CVD (RPCVD), plasma enhanced CVD (PECVD), coating, etc. The isolation layer 30 may be patterned to define the locations of the contact plugs 31, 33 formed in the subsequent operations. The contact plug 31 may be disposed over the first doped region 101. The contact plug 33 may be disposed over the second doped region 102. Then, the bit-line structure 32 may be electrically connected with the contact plug 31. The memory element 34 may be electrically connected with the contact plug 33.

In some embodiments, subsequent to the formation of the memory element 34, a wiring layer (not shown in the figures) may be formed on the memory element 34. For example, the wiring layer may have a multilayer wiring structure which includes a plurality of wiring layers and interlayer insulating films.

Figure 6:
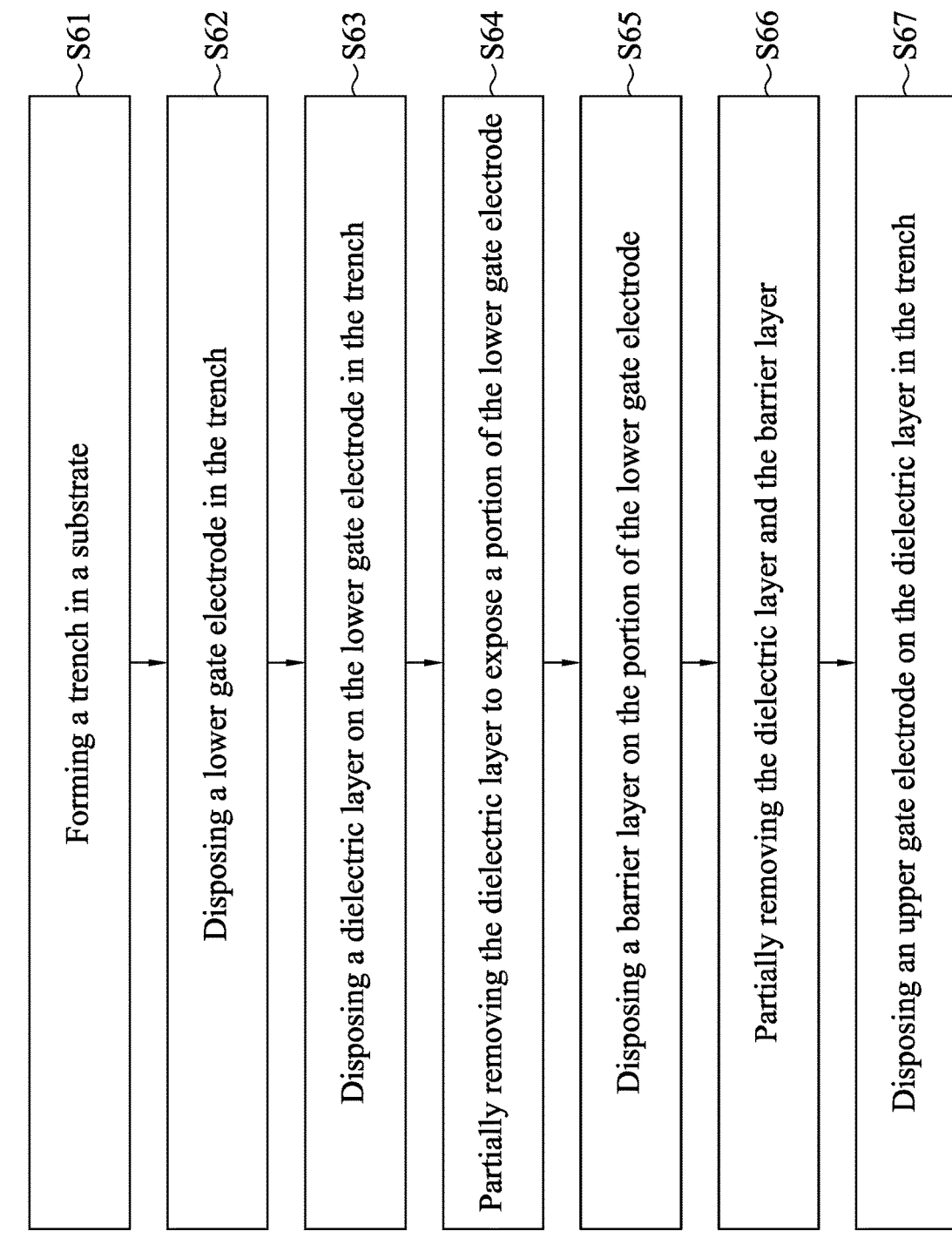
FIG. 6 illustrates a flow chart of a method of manufacturing a semiconductor device in accordance with some embodiments of the present disclosure.

FIG. 6 illustrates a flow chart of a method 60 of manufacturing a semiconductor device in accordance with some embodiments of the present disclosure.

In some embodiments, the method 60 may include a step S61 of forming a trench in a substrate. For example, as shown in FIG. 5B, the plurality of trenches 10t1 and 10t2 may be formed in the substrate 10.

In some embodiments, the method 60 may include a step S62 of disposing a lower gate electrode in the trench. For example, as shown in FIG. 5E, the conductive layer e1 may be formed in the trenches 10t1 and 10t2. For example, as shown in FIG. 5F, the lower gate electrodes 11e1 and 12e1 may be formed by performing the etch-back process on the conductive layer e1.

In some embodiments, the method 60 may include a step S63 of disposing a dielectric layer on the lower gate electrode in the trench. For example, as shown in FIG. 5G, the first dielectric material d2 may be formed on the lower gate electrode 12e1. Similarly, the first dielectric material d2 may be formed on the lower gate electrode 11e1.

In some embodiments, the method 60 may include a step S64 of partially removing the dielectric layer to expose a portion of the lower gate electrode. For example, as shown in FIG. 5H, a part of the first dielectric material d2 may be removed to expose a portion 12e1u of the lower gate electrode 12e1.

In some embodiments, the method 60 may include a step S65 of disposing a first barrier layer on the portion of the lower gate electrode. For example, as shown in FIG. 5I, the first barrier layer 12b2 may be formed on the portion 12e1u of the lower gate electrode 12e1.

In some embodiments, the method 60 may include a step S66 of partially removing the dielectric layer and the first barrier layer. For example, as shown in FIG. 5J, a part of the first barrier layer 12b2 and a part of the first dielectric layer 12d2 may be removed.

In some embodiments, the method 60 may include a step S67 of disposing an upper gate electrode on the dielectric layer in the trench. For example, as shown in FIG. 5K, the conductive layer e2 may fill each trench. As shown in FIG. 5L, the upper gate electrodes 11e2 and 12e2 may be formed by performing the etch-back process on the conductive layer e2.

One aspect of the present disclosure provides a semiconductor device. The semiconductor device includes a substrate having a trench and a gate structure in the trench. The gate structure includes a lower gate electrode and an upper gate electrode over the lower gate electrode. The gate structure also includes a first barrier layer disposed between the lower gate electrode and the upper gate electrode. The gate structure also includes a first dielectric layer disposed between the lower gate electrode and the upper gate electrode. The first dielectric layer is adjacent to the first barrier layer.

Another aspect of the present disclosure provides a semiconductor device. The semiconductor device includes a substrate having a trench and a gate structure in the trench. The gate structure includes a lower gate electrode and a lower dielectric layer between the lower gate electrode and the substrate. The gate structure also includes a first barrier layer over the lower gate electrode. The first barrier layer is spaced apart from the lower dielectric layer.

Another aspect of the present disclosure provides a method of manufacturing a semiconductor device. The method includes forming a trench in a substrate and disposing a lower gate electrode in the trench. The method also includes disposing a first dielectric layer on the lower gate electrode in the trench and partially removing the first dielectric layer to expose a portion of the lower gate electrode.

Forming a protection layer before disposing a barrier layer can prevent the gate dielectric layer (or a sidewall dielectric) from been damaged or consumed. Therefore, the effective electric field can be reduced and, consequently, GIDL can be reduced. A data retention time can be extended, and the operational reliability of the semiconductor device can also be improved.

In addition, a residual portion of the protection layer may be adjacent to the barrier layer. By using a protection layer having a low dielectric constant (such as lower than the dielectric constant of the sidewall dielectric), the effective electric field between the lower gate electrode and the upper gate electrode can be further decreased, which helps to mitigate GIDL while maintaining good device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
    forming a trench in a substrate;
    disposing a lower gate electrode in the trench;
    disposing a first dielectric layer on the lower gate electrode in the trench;
    partially removing the first dielectric layer to expose a portion of the lower gate electrode, wherein a remained first dielectric layer covers another portion of the lower gate electrode;
    disposing a first barrier layer on the portion of the lower gate electrode; and
    forming a coplanar surface of the first barrier layer and the first dielectric layer.

2. The method of claim 1, further comprising:
    partially removing the first dielectric layer and the first barrier layer.

3. The method of claim 2, further comprising:
    before disposing the lower gate electrode, forming a second dielectric layer in the trench.

4. The method of claim 3, wherein the second dielectric layer is protected by the first dielectric layer when the first dielectric layer and the first barrier layer are removed.

5. The method of claim 1, further comprising:
    before disposing the lower gate electrode, forming a second barrier layer in the trench.

6. The method of claim 1, further comprising:
    disposing an upper gate electrode on the first dielectric layer.

7. A method of manufacturing a semiconductor device, comprising:
    providing a substrate having a trench; and
    forming a gate structure in the trench, comprising:
    forming a lower gate electrode;
    forming an upper gate electrode over the lower gate electrode;
    forming a first barrier layer between the lower gate electrode and the upper gate electrode; and
    forming a first dielectric layer between the lower gate electrode and the upper gate electrode;
    wherein the first dielectric layer is adjacent to the first barrier layer, the first dielectric layer partially covers the lower gate electrode;
    wherein an upper surface of the first barrier layer and an upper surface of the first dielectric layer are substantially coplanar.

8. The method of claim 7, wherein the first barrier layer contacts the lower gate electrode and the upper gate electrode.

9. The method of claim 8, wherein the first dielectric layer contacts the lower gate electrode and the upper gate electrode.

10. The method of claim 7, wherein the first barrier layer and the first dielectric layer comprise different nitrides.

11. The method of claim 7, further comprising:
    forming a second dielectric layer between the lower gate electrode and the substrate.

12. The method of claim 11, wherein the first barrier layer is spaced apart from the second dielectric layer by the first dielectric layer.

13. The method of claim 11, wherein the second dielectric layer comprises a sidewall between the upper gate electrode and the substrate.

14. The method of claim 7, wherein the sidewall of the second dielectric layer is substantially perpendicular to an upper surface of the first barrier layer.

15. The method of claim 7, wherein the first dielectric layer comprises a curved surface, and wherein the curved surface of the first dielectric layer is covered by the first barrier layer.

16. The method of claim 7, further comprising:
forming a second barrier layer between the lower gate electrode and the substrate;
wherein second barrier layer contacts the first dielectric layer.

17. A method of manufacturing a semiconductor device, comprising:
providing a substrate having a trench; and
forming a gate structure in the trench, comprising:
forming a lower gate electrode;
forming an upper gate electrode over the lower gate electrode;
forming a first barrier layer between the lower gate electrode and the upper gate electrode; and
forming a first dielectric layer between the lower gate electrode and the upper gate electrode;
wherein the first dielectric layer is adjacent to the first barrier layer, the first dielectric layer partially covers the lower gate electrode;
wherein a lower surface of the first barrier layer and a lower surface of the first dielectric layer are substantially coplanar.

* * * * *